(12) United States Patent
Kim

(10) Patent No.: US 12,080,795 B2
(45) Date of Patent: Sep. 3, 2024

(54) SEMICONDUCTOR DEVICE

(71) Applicant: SAMSUNG ELECTRONICS CO., LTD., Suwon-si (KR)

(72) Inventor: Sung Min Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 298 days.

(21) Appl. No.: 17/517,941

(22) Filed: Nov. 3, 2021

(65) Prior Publication Data

US 2022/0320329 A1 Oct. 6, 2022

(30) Foreign Application Priority Data

Apr. 5, 2021 (KR) .................. 10-2021-0044038

(51) Int. Cl.
| | |
|---|---|
| *H01L 29/78* | (2006.01) |
| *H01L 23/528* | (2006.01) |
| *H01L 27/088* | (2006.01) |
| *H01L 29/06* | (2006.01) |
| *H01L 29/417* | (2006.01) |

(52) U.S. Cl.
CPC ........ *H01L 29/785* (2013.01); *H01L 23/5286* (2013.01); *H01L 27/0886* (2013.01); *H01L 29/0669* (2013.01); *H01L 29/41791* (2013.01)

(58) Field of Classification Search
CPC .............. H01L 29/785; H01L 29/0669; H01L 29/41791; H01L 23/5286; H01L 27/0886
See application file for complete search history.

(56) References Cited

U.S. PATENT DOCUMENTS

| | | |
|---|---|---|
| 8,443,306 B1 | 5/2013 | Dhong et al. |
| 9,570,395 B1 | 2/2017 | Sengupta et al. |
| 10,586,765 B2 | 3/2020 | Smith et al. |
| 10,700,207 B2 | 6/2020 | Chen et al. |
| 2020/0134128 A1 | 4/2020 | Peng et al. |
| 2020/0266169 A1 | 8/2020 | Kang et al. |
| 2020/0373240 A1 | 11/2020 | Vadi |
| 2020/0373241 A1 | 11/2020 | Gerousis et al. |
| 2020/0373331 A1 | 11/2020 | Kim et al. |

FOREIGN PATENT DOCUMENTS

KR  10-2021-0082307 A   7/2021

OTHER PUBLICATIONS

Indian Office action dated Oct. 18, 2022 for corresponding IN Application No. 202224008460.

*Primary Examiner* — Timor Karimy
(74) *Attorney, Agent, or Firm* — Muir Patent Law, PLLC

(57) ABSTRACT

A semiconductor device includes a base substrate, a first electrode plate on the base substrate, a first power rail on the first electrode plate, the first power rail extending in a first horizontal direction and overlapping the first electrode plate in a vertical direction, a second power rail on the first electrode plate, the second power rail extending in the first horizontal direction and overlapping the first electrode plate in the vertical direction, and the second power rail being spaced apart from the first power rail in a second horizontal direction different from the first horizontal direction, a first power rail contact electrically connecting the first electrode plate and the first power rail, an insulating layer on the base substrate to surround the first electrode plate, the first power rail, and the second power rail, and a gate electrode extending in the second horizontal direction on the insulating layer.

20 Claims, 28 Drawing Sheets

//]: #

SEMICONDUCTOR DEVICE

CROSS-REFERENCE TO RELATED APPLICATION

This application claims priority from Korean Patent Application No. 10-2021-0044038 filed on Apr. 5, 2021, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor device.

2. Description of the Related Art

As one of scaling technologies for increasing the density of semiconductor devices, a multi gate transistor, in which a silicon body of a fin or nanowire shape is formed on a substrate and a gate is formed on a surface of the silicon body, has been proposed. Since such a multi gate transistor utilizes a three-dimensional channel, scaling is easily performed. Further, even if a gate length of the multi gate transistor is not increased, the current control capability may be improved. Furthermore, a short channel effect (SCE), in which potential of a channel region is influenced by a drain voltage, may be effectively suppressed.

SUMMARY

According to an exemplary embodiment of the present disclosure, there is provided a semiconductor device, including a base substrate, a first electrode plate disposed on the base substrate, a first power rail which extends in a first horizontal direction on the first electrode plate and overlaps the first electrode plate in a vertical direction, a second power rail which extends in the first horizontal direction on the first electrode plate, is spaced apart from the first power rail in a second horizontal direction different from the first horizontal direction, and overlaps the first electrode plate in the vertical direction, a first power rail contact which electrically connects the first electrode plate and the first power rail, an insulating layer which is disposed on the base substrate and surrounds the first electrode plate, the first power rail and the second power rail, and a gate electrode extending in the second horizontal direction on the insulating layer.

According to an exemplary embodiment of the present disclosure, there is provided a semiconductor device, including a base substrate, a first electrode plate disposed on the base substrate, a second electrode plate disposed on the first electrode plate, a first power rail extending in a horizontal direction on the second electrode plate, a second power rail which extends in the first horizontal direction on the second electrode plate, and is spaced apart from the first power rail in a second horizontal direction different from the first horizontal direction, an active pattern extending in the first horizontal direction on the first power rail, a gate electrode which extends in the second horizontal direction on the active pattern and intersects each of the first and second power rails, a source/drain region disposed on both side walls of the gate electrode, a source/drain contact which penetrates the source/drain region in a vertical direction on a first side wall of the gate electrode and electrically connects the source/drain region to the first power rail, and a power rail contact which penetrates the second electrode plate in the vertical direction and electrically connects the first electrode plate and the first power rail.

According to an exemplary embodiment of the present disclosure, there is provided a semiconductor device, including a base substrate, a first electrode plate which is disposed on the base substrate and has a flat plate shape, a second electrode plate which is disposed on the first electrode plate and has a flat plate shape, a first power rail which extends in a first horizontal direction on the second electrode plate, and overlaps each of the first and second electrode plates in a vertical direction, a second power rail which extends in the first horizontal direction on the second electrode plate, is spaced apart from the first power rail in a second horizontal direction different from the first horizontal direction, and overlaps each of the first and second electrode plates in the vertical direction, a first power rail contact which penetrates the second electrode plate in the vertical direction, and electrically connects the first electrode plate and the first power rail, a second power rail contact which extends in the vertical direction on an upper surface of the second electrode plate, and electrically connects the second electrode plate to the second power rail, an insulating layer which is disposed on the base substrate, and surrounds the first electrode plate, the second electrode plate, the first power rail and the second power rail, a gate electrode extending in the second horizontal direction on the insulating layer, a source/drain region disposed on both side walls of the gate electrode, a first source/drain contact which penetrates the source/drain region in the vertical direction on a first side wall of the gate electrode, and electrically connects the source/drain region to the first power rail, and a second source/drain contact which extends from an upper surface of the source/drain region in the vertical direction, on a second side wall of the gate electrode opposite to the first side wall of the gate electrode.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
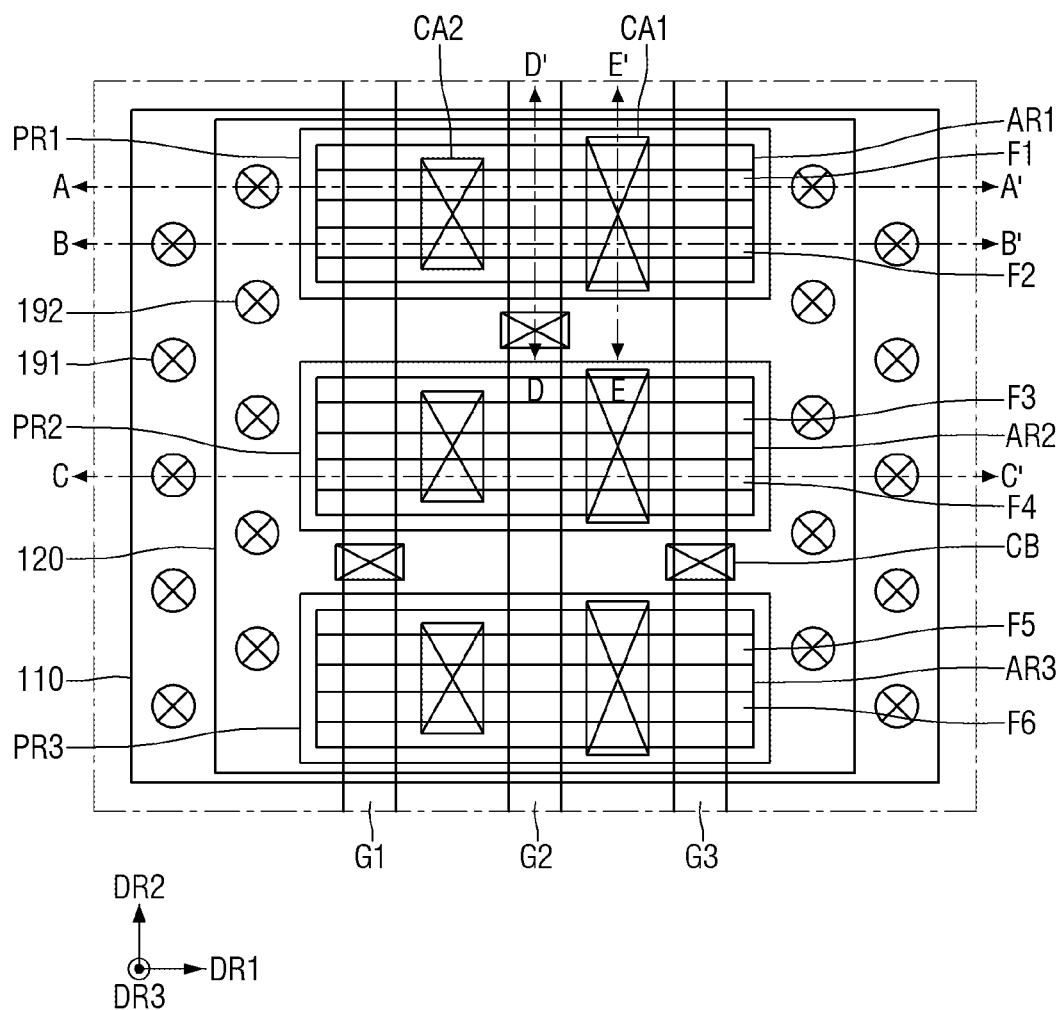
FIG. 1 is a layout diagram of a semiconductor device according to some embodiments of the present disclosure.
Figure 2:
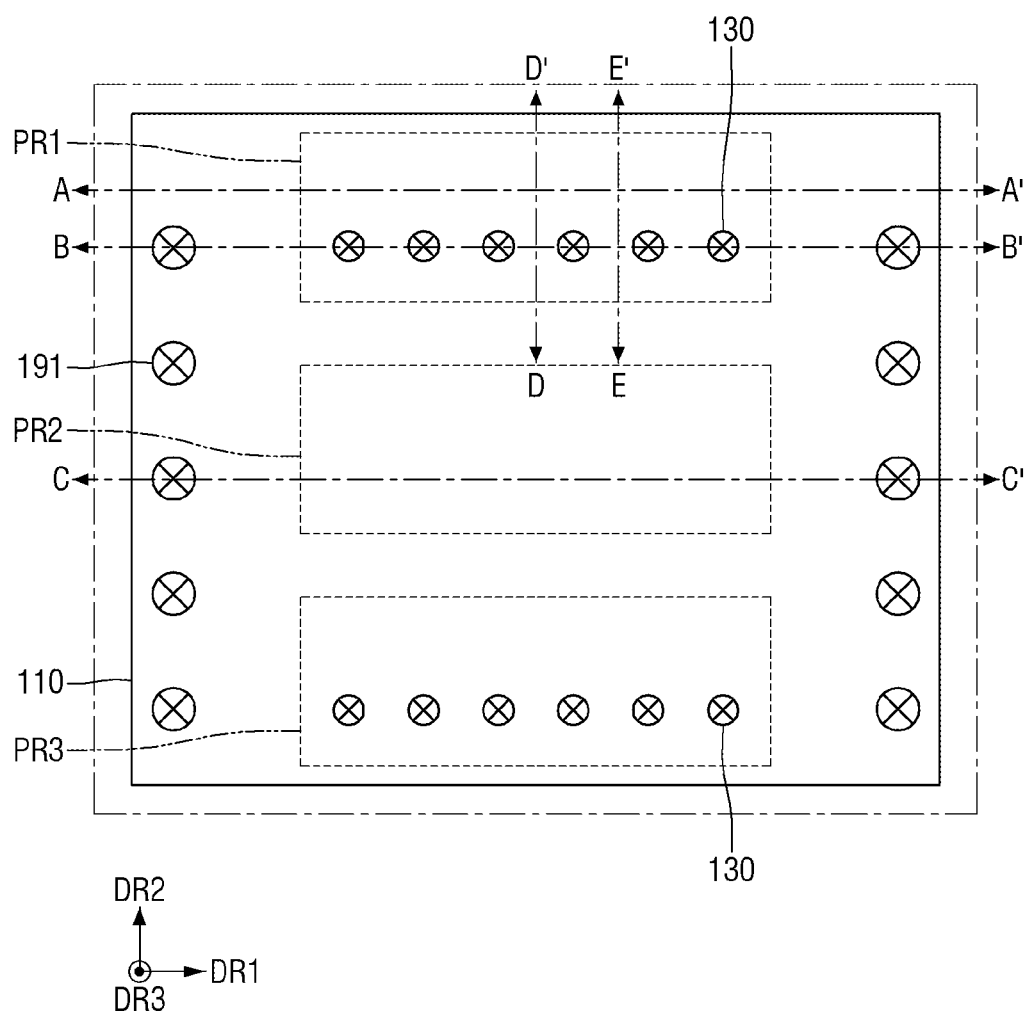
FIG. 2 is a layout diagram of a first electrode plate of a semiconductor device according to some embodiments of the present disclosure.
Figure 3:
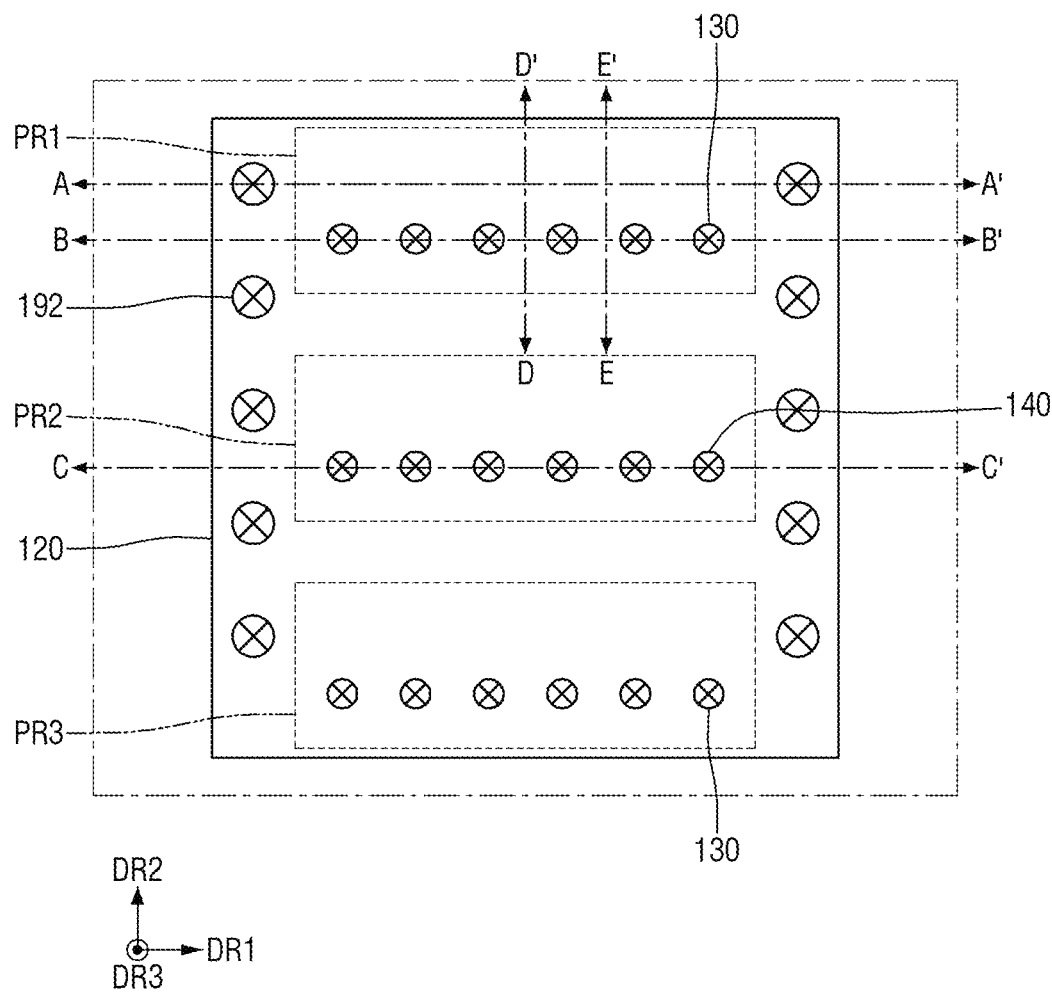
FIG. 3 is a layout diagram of a second electrode plate of the semiconductor device according to some embodiments of the present disclosure.
Figure 4:
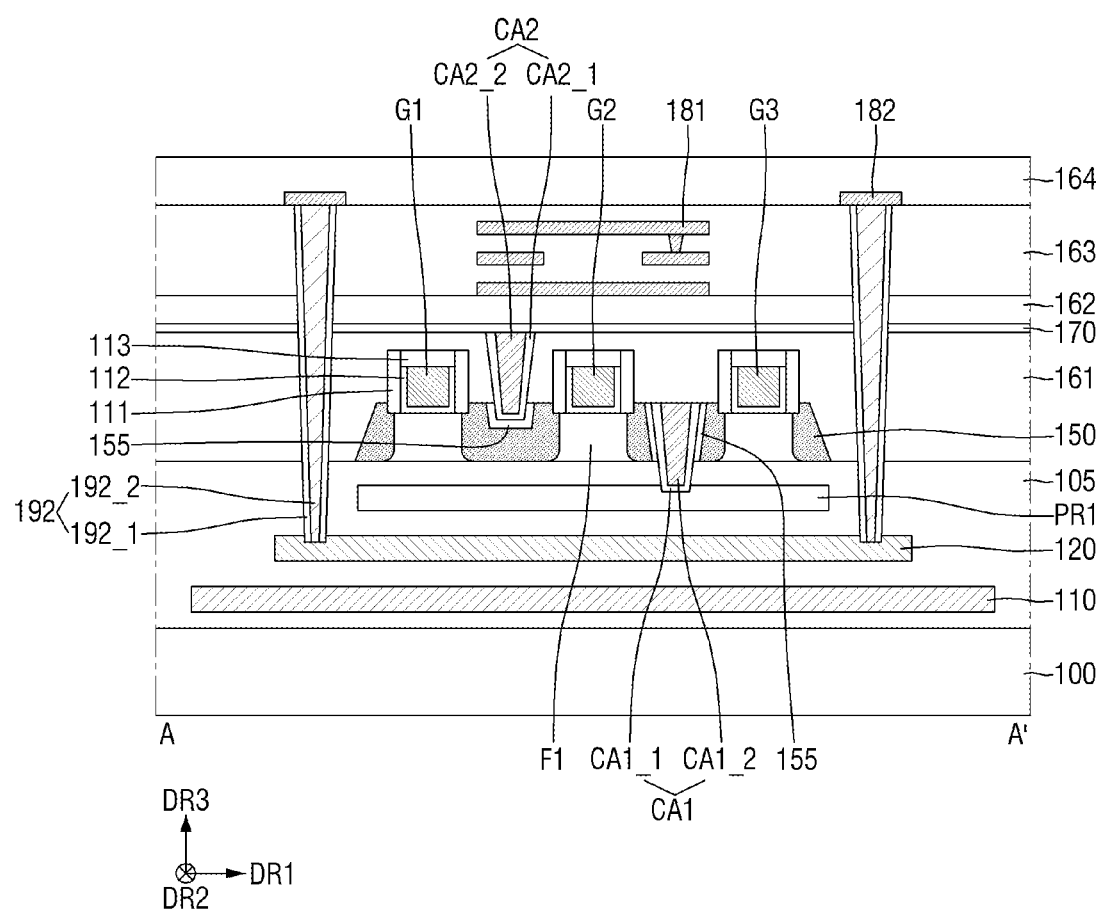
FIG. 4 is a cross-sectional view taken along line A-A' of FIGS. 1 to 3.
Figure 5:
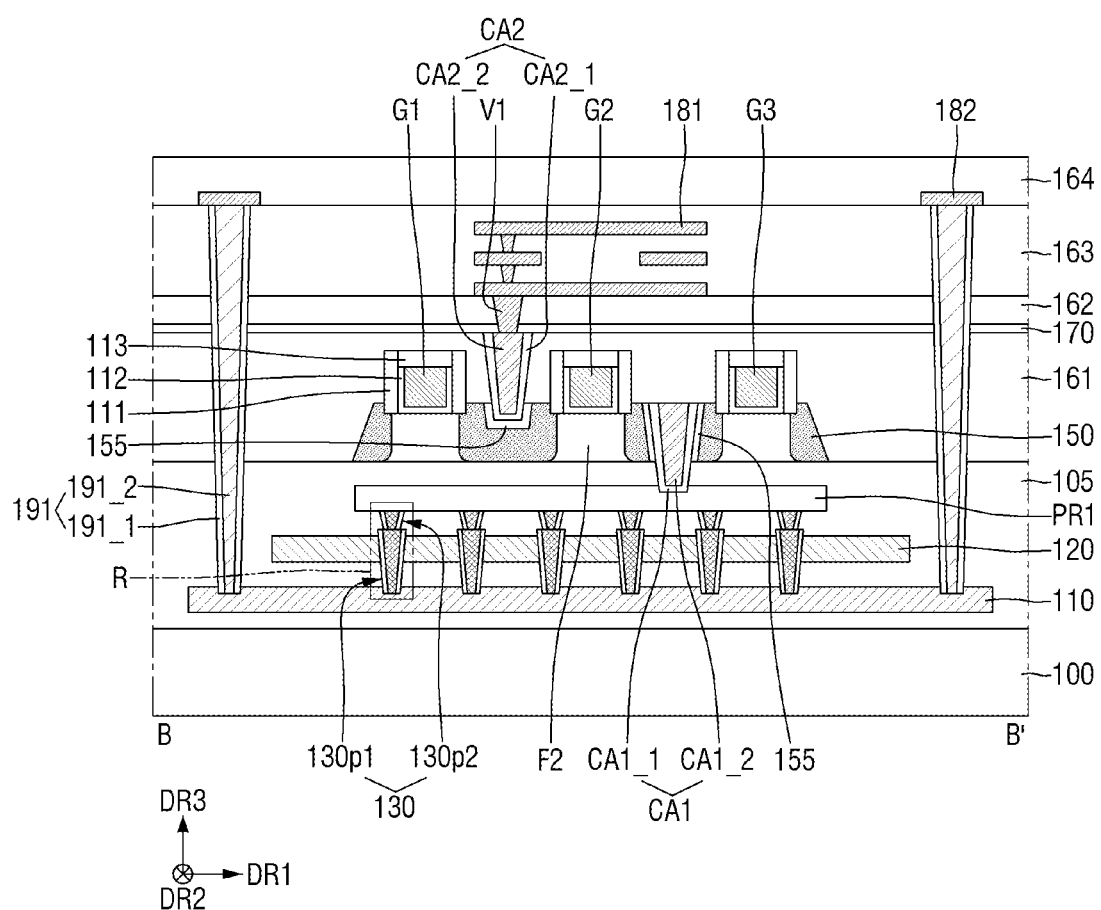
FIG. 5 is a cross-sectional view taken along line B-B' of FIGS. 1 to 3.
Figure 6:
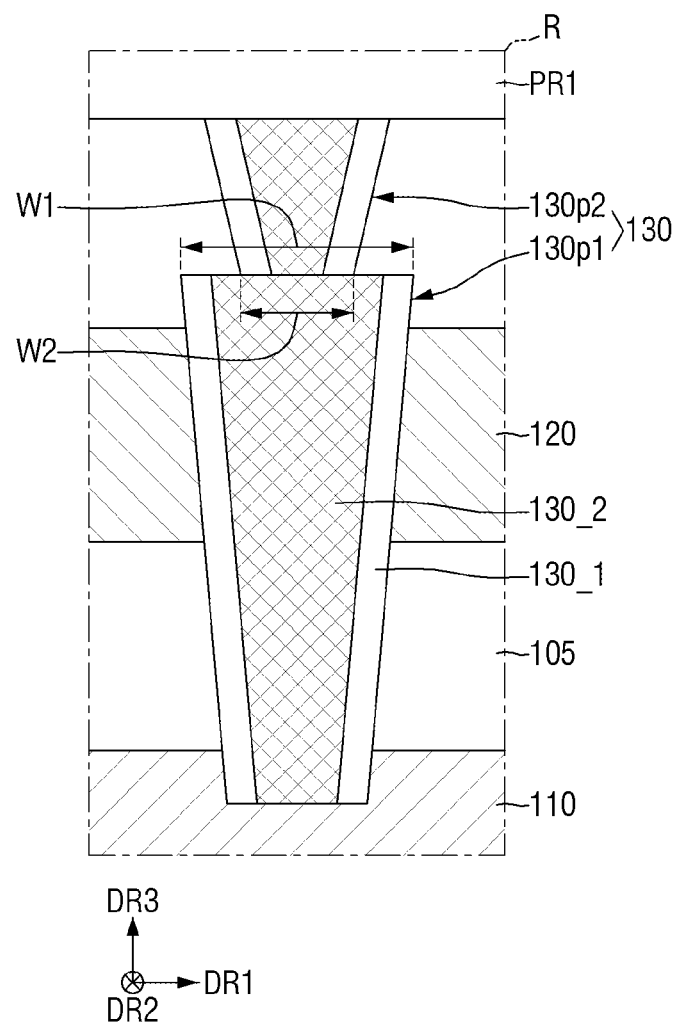
FIG. 6 is an enlarged view of region R of FIG. 5.
Figure 7:
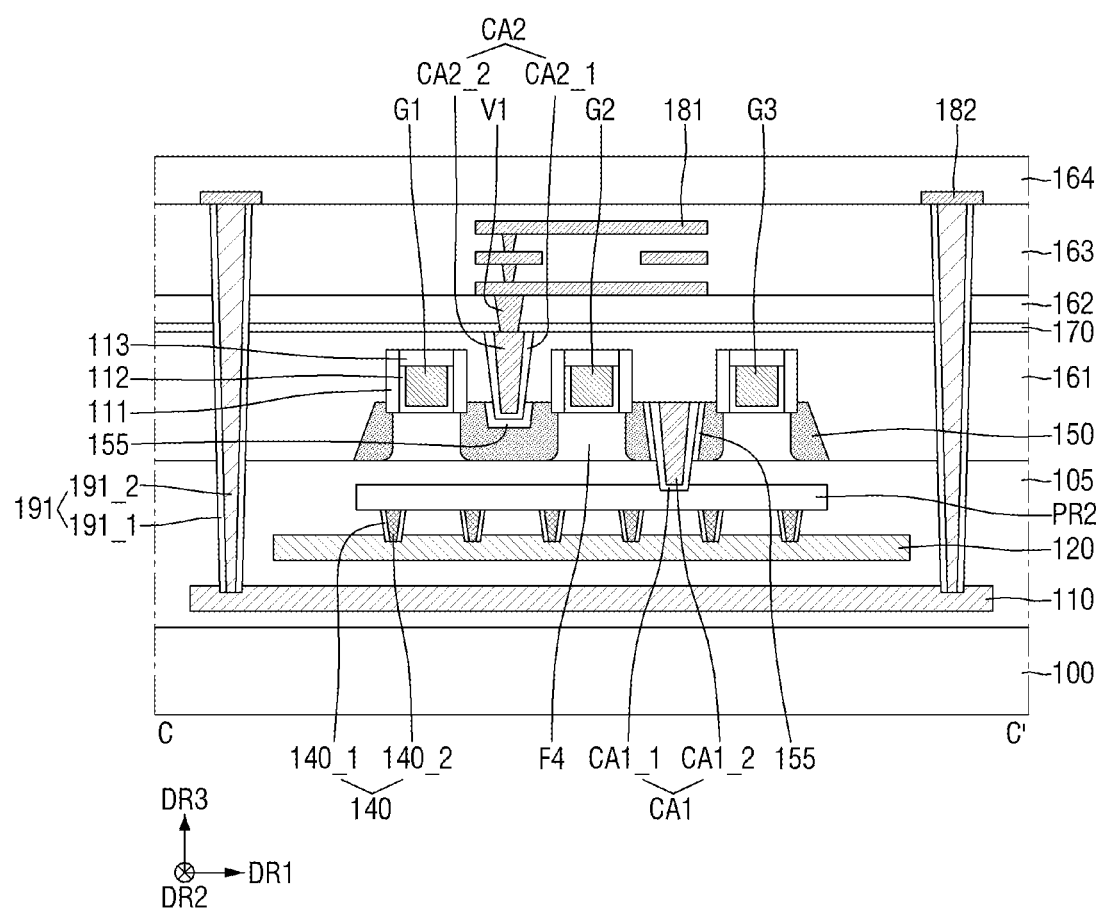
FIG. 7 is a cross-sectional view taken along line C-C' of FIGS. 1 to 3.
Figure 8:
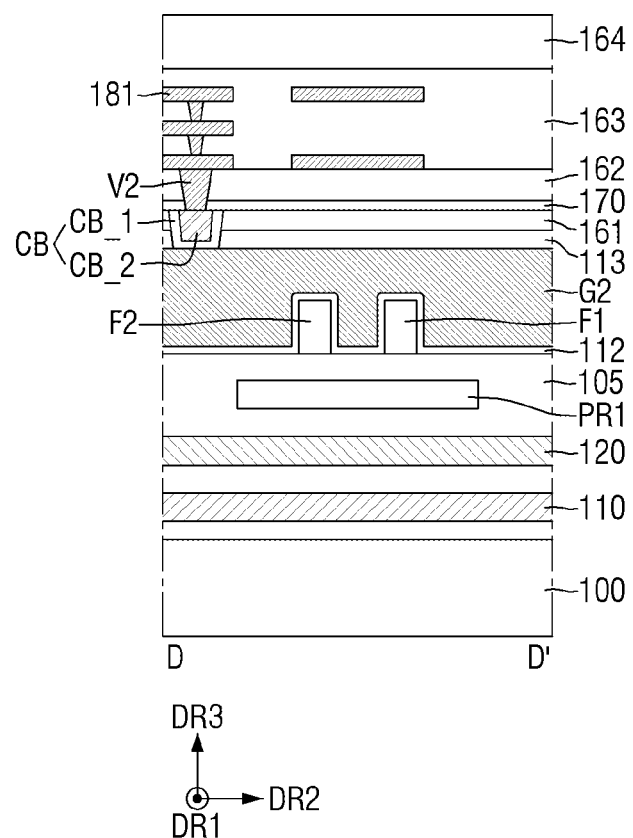
FIG. 8 is a cross-sectional view taken along line D-D' of FIGS. 1 to 3.
Figure 9:
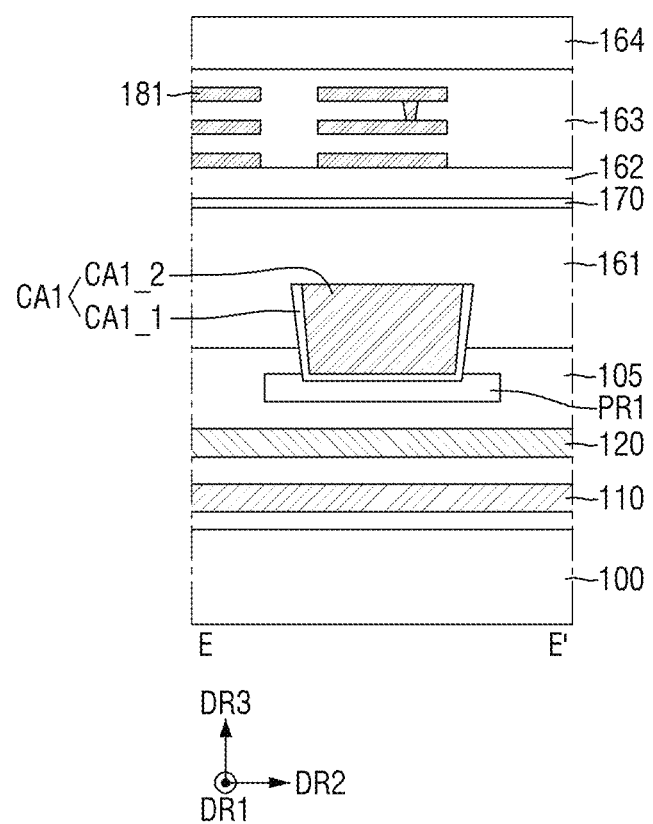
FIG. 9 is a cross-sectional view taken along line E-E' of FIGS. 1 to 3.

FIG. 1 is a layout diagram of a semiconductor device according to some embodiments of the present disclosure. FIG. 2 is a layout diagram of a first electrode plate of a semiconductor device according to some embodiments of the present disclosure. FIG. 3 is a layout diagram of a second electrode plate of the semiconductor device according to some embodiments of the present disclosure. FIG. 4 is a cross-sectional view taken along line A-A' of FIGS. 1 to 3. FIG. 5 is a cross-sectional view taken along line B-B' of FIGS. 1 to 3. FIG. 6 is an enlarged view of region R of FIG. 5. FIG. 7 is a cross-sectional view taken along line C-C' of FIGS. 1 to 3. FIG. 8 is a cross-sectional view taken along line D-D' of FIGS. 1 to 3. FIG. 9 is a cross-sectional view taken along line E-E' of FIGS. 1 to 3.

Referring to FIGS. 1 to 9, a semiconductor device according to some embodiments of the present disclosure may include a base substrate 100, an insulating layer 105, a first electrode plate 110, a second electrode plate 120, first to third power rails PR1 to PR3, first to third active regions AR1 to AR3, first to sixth active patterns F1 to F6, first to third gates electrodes G1 to G3, a gate spacer 111, a gate insulating layer 112, a capping pattern 113, first and second power rail contacts 130 and 140, a source/drain region 150, a silicide layer 155, first and second source/drain contacts CA1 and CA2, a gate contact CB, first to fourth interlayer insulating layers 161 to 164, an etching stop layer 170, first and second vias V1 and V2, a first and second wiring layers 181 and 182, and first and second electrode plate contacts 191 and 192.

The base substrate 100 may be, e.g., a silicon substrate. The insulating layer 105 may be disposed on the base substrate 100. The insulating layer 105 may include an insulating material. The insulating layer 105 may include, e.g., at least one of silicon oxide, silicon nitride, silicon oxynitride and a low dielectric constant material. The low dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethylCycloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first electrode plate 110 may be disposed on the upper surface of the base substrate 100. The first electrode plate 110 may be disposed inside the insulating layer 105, e.g., the first electrode plate 110 may be completely embedded within the insulating layer 105. The first electrode plate 110 may have a flat plate shape in a plane defined by a first horizontal direction DR1 and a second horizontal direction DR2. The first electrode plate 110 may be made of, e.g., a single flat plate. In some other embodiments, the first electrode plate 110 may be made of a plurality of flat plates spaced apart from each other in the first horizontal direction DR1 or the second horizontal direction DR2. The first electrode plate 110 may include a conductive material. The first electrode plate 110 may be, e.g., a first power supply node VCC.

The second electrode plate 120 may be disposed on the first electrode plate 110, e.g., the second electrode plate 120 may be vertically spaced apart from the first electrode plate 110 in a vertical direction DR3. The second electrode plate 120 may be disposed inside the insulating layer 105, e.g., a portion of the insulating layer 105 may separate the first and second electrode plates 110 and 120. The second electrode plate 120 may have a flat plate shape in a plane defined by the first horizontal direction DR1 and the second horizontal direction DR2, e.g., the second electrode plate 120 may be completely embedded within the insulating layer 105. The second electrode plate 120 may be made of, e.g., a single flat plate. In some other embodiments, the second electrode plate 120 may be made of a plurality of flat plates spaced apart from each other in the first horizontal direction DR1 or the second horizontal direction DR2.

For example, a width of the second electrode plate 120 in the first horizontal direction DR1 may be smaller than a width of the first electrode plate 110 in the first horizontal direction DR1. However, the present disclosure is not limited thereto. The second electrode plate 120 may include a conductive material. The second electrode plate 120 may be, e.g., a second power supply node VDD.

Each of the first to third power rails PR1, PR2 and PR3 may be disposed on the second electrode plate 120, e.g., each of the first to third power rails PR1, PR2 and PR3 may be spaced apart from the second electrode plate 120 along the vertical direction DR3 with a portion of the insulating layer 105 therebetween. Each of the first to third power rails PR1, PR2 and PR3 may be disposed inside the insulating layer 105. The insulating layer 105 may be disposed on the upper surface of each of the first to third power rails PR1, PR2 and PR3, e.g., the first to third power rails PR1, PR2 and PR3 may be completely embedded within the insulating layer 105.

For example, each of the first to third power rails PR1, PR2 and PR3 may extend in the first horizontal direction DR1, e.g., the first to third power rails PR1, PR2 and PR3 may be coplanar with each other while being spaced apart from each other in the second horizontal direction DR2. In some other embodiments, the shapes of each of the first to third power rails PR1, PR2 and PR3 are not limited.

The second power rail PR2 may be spaced apart from the third power rail PR3 in the second horizontal direction DR2. The first power rail PR1 may be spaced apart from the second power rail PR2 in the second horizontal direction DR2. Each of the first to third power rails PR1, PR2 and PR3 may overlap each of the first electrode plate 110 and the second electrode plate 120 in the vertical direction DR3 perpendicular to the first and second horizontal directions DR1 and DR2.

For example, widths of each of the first to third power rails PR1, PR2 and PR3 in the first horizontal direction DR1 may be smaller than the width of the second electrode plate 120 in the first horizontal direction DR1. Each of the first to third power rails PR1, PR2 and PR3 may include a conductive material.

The first power rail contact 130 may extend in the vertical direction DR3 from the first electrode plate 110 to the first power rail PR1 and from the first electrode plate 110 to the third power rail PR3. The first power rail contact 130 may penetrate the second electrode plate 120 in the vertical direction DR3. The first power rail contact 130 may electrically connect the first electrode plate 110 and the first power rail PR1. Further, the first power rail contact 130 may extend in the vertical direction DR3 from the first electrode plate 110 to the third power rail PR3 to electrically connect the first electrode plate 110 and the third power rail PR3.

For example, as illustrated in FIG. 2, a plurality of first power rail contacts 130 may be spaced apart from each other in the first horizontal direction DR1 along each of the first and third power rails PR1 and PR3. Although FIG. 2 shows that six first power rail contacts 130 are spaced apart from each other in the first horizontal direction DR1 in each of the first and third power rails PR1 and PR3, this is only for convenience of explanation, and the position and number of the first power rail contacts 130 connected to each of the first power rail PR1 and the third power rail PR3 are not limited.

The first power rail contact 130 may include a first portion 130p1 and a second portion 130p2. The first portion 130p1 of the first power rail contact 130 may be connected to the first electrode plate 110. The first portion 130p1 of the first power rail contact 130 may penetrate, e.g., an entire thickness of, the second electrode plate 120 in the vertical direction DR3. For example, the upper surface of the first portion 130p1 of the first power rail contact 130 may be formed to be higher than the upper surface of the second electrode plate 120, e.g., the first portion 130p1 of the first power rail contact 130 may extend above the upper surface of the second electrode plate 120.

The second portion 130p2 of the first power rail contact 130 may be connected to the upper surface of the first portion 130p1 of the first power rail contact 130. The second portion 130p2 of the first power rail contact 130 may be connected to each of the first power rail PR1 and the third power rail PR3.

For example, a width W1 of the upper surface of the first portion 130p1 of the first power rail contact 130 in the first horizontal direction DR1 may be greater than a width W2 of the lower surface of the second portion 130p2 of the first power rail contact 130 in the first horizontal direction DR1. For example, as illustrated in FIG. 6, the second portion 130p2 may be centered on the upper surface of the first portion 130p1, so the upper surface of the first portion 130p1 may extend horizontally, e.g., along the first horizontal direction DR1, beyond the lower surface of second portion 130p2.

The first power rail contact 130 may include a first barrier layer 130_1 and a first filling layer 130_2. The first barrier layer 130_1 may form side walls of the first power rail contact 130. The first filling layer 130_2 may fill the space between the first barrier layers 130_1.

The first barrier layer 130_1 may include, e.g., at least one of silicon oxide, silicon nitride, silicon oxynitride, and a low dielectric constant material. Although the first filling layer 130_2 may include, e.g., at least one of aluminum (Al), tungsten (W), cobalt (Co), ruthenium (Ru), and molybdenum (Mo), the present disclosure is not limited thereto.

The second power rail contact 140 may extend in the vertical direction DR3 from the second electrode plate 120 to the second power rail PR2. The second power rail contact 140 may electrically connect the second electrode plate 120 and the second power rail PR2.

For example, as illustrated in FIG. 3, a plurality of second power rail contacts 140 may be spaced apart from each other in the first horizontal direction DR1 the second power rail PR2. Although FIG. 3 shows that six second power rail contacts 140 are spaced apart from each other in the first horizontal direction DR1, this is only for convenience of explanation, and the position and number of second power rail contacts 140 connected to the second power rail PR2 are not limited.

The second power rail contact 140 may include a second barrier layer 140_1 and a second filling layer 140_2. The second barrier layer 140_1 may form side walls of the second power rail contact 140. The second filling layer 140_2 may fill the space between the second barrier layers 140_1.

The second barrier layer 140_1 may include, e.g., at least one of silicon oxide, silicon nitride, silicon oxynitride, and a low dielectric constant material. Although the second filling layer 140_2 may include, e.g., at least one of aluminum (Al), tungsten (W), cobalt (Co), ruthenium (Ru), and molybdenum (Mo), the present disclosure is not limited thereto.

Each of the first to third active regions AR1, AR2 and AR3 may be defined on the upper surface of the insulating layer 105. The first active region AR1 may be disposed on the first power rail PR1. The second active region AR2 may be disposed on the second power rail PR2. The third active region AR3 may be disposed on the third power rail PR3.

Each of the first to third active regions AR1, AR2 and AR3 may extend in the first horizontal direction DR1. The second active region AR2 may be spaced apart from the third active region AR3 in the second horizontal direction DR2. The first active region AR1 may be spaced apart from the second active region AR2 in the second horizontal direction DR2.

Each of the first active pattern F1 and the second active pattern F2 may be disposed in the first active region AR1. Each of the first active pattern F1 and the second active pattern F2 may protrude in the vertical direction DR3 from the upper surface of the insulating layer 105. Each of the first active pattern F1 and the second active pattern F2 may extend in the first horizontal direction DR1. The first active pattern F1 may be spaced apart from the second active pattern F2 in the second horizontal direction DR2.

Each of the third active pattern F3 and the fourth active pattern F4 may be disposed in the second active region AR2. Each of the third active pattern F3 and the fourth active pattern F4 may protrude in the vertical direction DR3 from the upper surface of the insulating layer 105. Each of the third active pattern F3 and the fourth active pattern F4 may extend in the first horizontal direction DR1. The third active pattern F3 may be spaced apart from the fourth active pattern F4 in the second horizontal direction DR2.

Each of the fifth active pattern F5 and the sixth active pattern F6 may be disposed in the third active region AR3. Each of the fifth active pattern F5 and the sixth active pattern F6 may protrude from the upper surface of the insulating layer 105 in the vertical direction DR3. Each of the fifth active pattern F5 and the sixth active pattern F6 may extend in the first horizontal direction DR1. The fifth active pattern F5 may be spaced apart from the sixth active pattern F6 in the second horizontal direction DR2.

Each of the first to third gate electrodes G1, G2 and G3 may extend in the second horizontal direction DR2 on the insulating layer 105. Each of the first to third gate electrodes G1, G2 and G3 may intersect each of the first to sixth active patterns F1 to F6 on the first to sixth active patterns F1 to F6. The second gate electrode G2 may be spaced apart from the first gate electrode G1 in the first horizontal direction DR1. The third gate electrode G3 may be spaced apart from the second gate electrode G2 in the first horizontal direction DR1.

Each of the first to third gate electrodes G1, G2 and G3 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first to third gate electrodes G1, G2 and G3 may include a conductive metal oxide, a conductive metal oxynitride, and the like, and may also include an oxidized form of the above-mentioned materials.

The gate spacer 111 may be disposed on both side walls of each of the first to third gate electrodes G1, G2 and G3. The gate spacer 111 may extend in the second horizontal direction DR2 along both side walls of each of the first to third gate electrodes G1, G2 and G3.

The gate spacer 111 may include, e.g., at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

The gate insulating layer 112 may be disposed between each of the first to third gate electrodes G1, G2 and G3 and the gate spacer 111. The gate insulating layer 112 may be disposed between each of the first to third gate electrodes G1, G2 and G3 and each of the first to sixth active patterns F1 to F6. The gate insulating layer 112 may be disposed between each of the first to third gate electrodes G1, G2 and G3 and the insulating layer 105.

The gate insulating layer 112 may include, e.g., silicon oxide, silicon oxynitride, silicon nitride, or a high dielectric constant material having a higher dielectric constant than silicon oxide. The high dielectric constant material may include, e.g., one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some embodiments may include an NC (Negative Capacitance) FET that uses a negative capacitor. For example, the gate insulating layer 112 may include a ferroelectric material layer having ferroelectric properties, and a paraelectric material layer having paraelectric properties.

The ferroelectric material layer may have a negative capacitance, and the paraelectric material layer may have a positive capacitance. For example, if two or more capacitors are connected in series and the capacitance of each capacitor has a positive value, the overall capacitance decreases from the capacitance of each of the individual capacitors. On the other hand, if at least one of the capacitances of two or more capacitors connected in series has a negative value, the overall capacitance may be greater than an absolute value of each of the individual capacitances, while having a positive value.

When the ferroelectric material layer having the negative capacitance and the paraelectric material layer having the positive capacitance are connected in series, the overall capacitance values of the ferroelectric material layer and the paraelectric material layer connected in series may increase. By the use of the increased overall capacitance value, a transistor including the ferroelectric material layer may have a subthreshold swing (SS) below 60 mV/decade at room temperature.

The ferroelectric material layer may have ferroelectric properties. The ferroelectric material layer may include, e.g., at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material layer may change, depending on which type of ferroelectric material is included in the ferroelectric material layer.

When the ferroelectric material layer includes hafnium oxide, the dopant included in the ferroelectric material layer may include, e.g., at least one of gadolinium (Gd), silicon (Si), zirconium (Zr), aluminum (Al), and yttrium (Y).

When the dopant is aluminum (Al), the ferroelectric material layer may include 3 at % (atomic %) to 8 at % aluminum. Here, a ratio of the dopant may be a ratio of aluminum to the sum of hafnium and aluminum.

When the dopant is silicon (Si), the ferroelectric material layer may include 2 at % to 10 at % silicon. When the dopant is yttrium (Y), the ferroelectric material layer may include 2 at % to 10 at % yttrium. When the dopant is gadolinium (Gd), the ferroelectric material layer may include 1 at % to 7 at % gadolinium. When the dopant is zirconium (Zr), the ferroelectric material layer may include 50 at % to 80 at % zirconium.

The paraelectric material layer may have the paraelectric properties. The paraelectric material layer may include, e.g., at least one of silicon oxide and metal oxide having a high dielectric constant. The metal oxide included in the paraelectric material layer may include, e.g., at least one of hafnium oxide, zirconium oxide, and aluminum oxide.

The ferroelectric material layer and the paraelectric material layer may include the same material. The ferroelectric material layer has the ferroelectric properties, but the paraelectric material layer may not have the ferroelectric properties. For example, when the ferroelectric material layer and the paraelectric material layer include hafnium oxide, a crystal structure of hafnium oxide included in the ferroelectric material layer is different from a crystal structure of hafnium oxide included in the paraelectric material layer.

The ferroelectric material layer may have a thickness having the ferroelectric properties. A thickness of the ferroelectric material layer may be, e.g., 0.5 nm to 10 nm. Since a critical thickness that exhibits the ferroelectric properties may change for each ferroelectric material, the thickness of the ferroelectric material layer may change depending on the ferroelectric material.

As an example, the gate insulating layer 112 may include one ferroelectric material layer. In another example, the gate insulating layer 112 may include a plurality of ferroelectric material layers spaced apart from each other. The gate insulating layer 112 may have a stacked layer structure in which the plurality of ferroelectric material layers and the plurality of paraelectric material layers are alternately stacked.

The capping pattern 113 may be disposed on each of the first to third gate electrodes G1, G2 and G3 between the gate spacers 111. The capping pattern 113 may extend in the second horizontal direction DR2. The capping pattern 113 may include, e.g., at least one of silicon nitride (SiN), silicon oxynitride (SiON), silicon oxide (SiO$_2$), silicon carbonitride (SiCN), silicon oxycarbonitride (SiOCN), and combinations thereof.

The source/drain region 150 may be disposed on at least one side wall of each of the first to third gate electrodes G1, G2 and G3 in a portion in which each of the first to third gate electrodes G1, G2 and G3 intersects each of the first to sixth fin type patterns F1 to F6. For example, the source/drain region 150 may be disposed on both side walls of each of the first to third gate electrodes G1, G2 and G3. A lower surface of the source/drain region 150 may be in, e.g., direct, contact with an upper surface of the insulating layer 105.

The first source/drain contact CA1 may be disposed between the second gate electrode G2 and the third gate electrode G3 on each of the first to third active regions AR1, AR2 and AR3. The first source/drain contact CA1 may penetrate the source/drain region 150 disposed between the second gate electrode G2 and the third gate electrode G3, and may penetrate the insulating layer 105 in the vertical direction DR3. The first source/drain contact CA1 may extend to each of the first to third power rails PR1, PR2 and PR3. The first source/drain contact CA1 may electrically connect each of the first to third power rails PR1, PR2 and PR3 and the source/drain regions 150.

For example, the upper surface of the first source/drain contact CA1 may be formed on the same plane as the upper surface of the source/drain region 150, e.g., upper surfaces of the first source/drain contact CA1 and the source/drain region 150 may be level with each other. The first source/drain contact CA1 may include a third barrier layer CA1_1 and a third filling layer CA1_2. The third barrier layer CA1_1 may form side walls and a bottom surface of the first source/drain contact CA1. The third filling layer CA1_2 may be disposed on the third barrier layer CA1_1.

The second source/drain contact CA2 may be disposed between the first gate electrode G1 and the second gate electrode G2 on each of the first to third active regions AR1, AR2 and AR3. The second source/drain contact CA2 may extend to the upper surface of the source/drain region 150 disposed between the second gate electrode G2 and the third gate electrode G3 in the vertical direction DR3.

The second source/drain contact CA2 may include a fourth barrier layer CA2_1 and a fourth filling layer CA2_2. The fourth barrier layer CA2_1 may form side walls and a bottom surface of the second source/drain contact CA2. The fourth filling layer CA2_2 may be disposed on the fourth barrier layer CA2_1.

Each of the third barrier layer CA1_1 and the fourth barrier layer CA2_1 may include, e.g., at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh). Each of the third filling layer CA1_2 and the fourth filling layer CA2_2 may include, e.g., at least one of aluminum (Al), tungsten (W), cobalt (Co), ruthenium (Ru), and molybdenum (Mo). However, the present disclosure is not limited thereto.

The silicide layer 155 may be disposed between the source/drain region 150 and the first source/drain contact CA1. Further, the silicide layer 155 may be disposed between the source/drain region 150 and the second source/drain contact CA2. The silicide layer 155 may contain, e.g., a metal silicide material.

The first interlayer insulating layer 161 may be disposed on the insulating layer 105. The first interlayer insulating layer 161 may be disposed to cover the upper surface of the insulating layer 105, the source/drain region 150, the gate spacer 111, the capping pattern 113, the first source/drain contact CA1, and the second source/drain contact CA2. The first interlayer insulating layer 161 may surround the first to third gate electrodes G1, G2 and G3. The first interlayer insulating layer 161 may include, e.g., at least one of silicon oxide, silicon nitride, silicon oxynitride, and a low dielectric constant material.

The gate contact CB penetrates the first interlayer insulating layer 161 and the capping pattern 113 in the vertical direction DR3 between the first active region AR1 and the second active region AR2, and may be connected to the second gate electrode G2. The gate contact CB penetrates the first interlayer insulating layer 161 and the capping pattern 113 in the vertical direction DR3 between the second active region AR2 and the third active region AR3, and may be connected to the first gate electrode G1. The gate contact CB penetrates the first interlayer insulating layer 161 and the capping pattern 113 in the vertical direction DR3 between the second active region AR2 and the third active region AR3, and may be connected to the third gate electrode G3. The position of the gate contact CB shown in FIG. 1 is an example, and the position of the gate contact CB is not limited.

The gate contact CB may include a fifth barrier layer CB_1 and a fifth filling layer CB_2, as illustrated in FIG. 8. The fifth barrier layer CB_1 may form side walls and a bottom surface of the gate contact CB. The fifth filling layer CB_2 may be disposed on the fifth barrier layer CB_1.

The fifth barrier layer CB_1 may include, e.g., at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh). Although the fifth filling layer CB_2 may include, e.g., at least one of aluminum (Al), tungsten (W), cobalt (Co), ruthenium (Ru), and molybdenum (Mo), the present disclosure is not limited thereto.

The etching stop layer 170 may be disposed on the first interlayer insulating layer 161. Although FIGS. 4 to 9 show that the etching stop layer 170 is formed of a single layer, the present disclosure is not limited thereto. For example, the etching stop layer 170 may be formed of a multi-layer. The etching stop layer 170 may include, e.g., at least one of silicon oxide, silicon nitride, silicon oxynitride, and a low dielectric constant material.

The second interlayer insulating layer 162, the third interlayer insulating layer 163, and the fourth interlayer insulating layer 164 may be sequentially disposed on the etching stop layer 170. The second interlayer insulating layer 162, the third interlayer insulating layer 163, and the fourth interlayer insulating layer 164 may include, e.g., at least one of silicon oxide, silicon nitride, silicon oxynitride, and a low dielectric constant material.

The first wiring layer 181 may be disposed inside the third interlayer insulating layer 163. The first wiring layer 181 may include a plurality of wirings spaced apart from each other in the first horizontal direction DR1, the second horizontal direction DR2 or the vertical direction DR3. The second wiring layer 182 may be disposed inside the fourth interlayer insulating layer 164. Each of the first wiring layer 181 and the second wiring layer 182 may include a conductive material.

The first via V1 may penetrate the second interlayer insulating layer 162 and the etching stop layer 170 in the vertical direction DR3 on the second source/drain contact CA2. The first via V1 may electrically connect the second source/drain contact CA2 to the first wiring layer 181. The second via V2 may penetrate the second interlayer insulating layer 162 and the etching stop layer 170 in the vertical direction DR3 on the gate contact CB. The second via V2 may electrically connect the gate contact CB and the first wiring layer 181. Each of the first via V1 and the second via V2 may include a conductive material.

The first electrode plate contact 191 may be disposed on, e.g., adjacent, the side walls of the second electrode plate 120. For example, as illustrated in FIG. 5, the first electrode plate contact 191 may extend vertically to, e.g., directly, contact the first electrode plate 110, e.g., the first electrode plate contact 191 may extend along the side walls of the second electrode plate 120 to partially penetrate the first electrode plate 110 at an edge of an upper surface thereof. The first electrode plate contact 191 may penetrate the insulating layer 105, the first interlayer insulating layer 161, the etching stop layer 170, the second interlayer insulating layer 162, and the third interlayer insulating layer 163 in the vertical direction DR3 to contact the upper surface of the first electrode plate 110. The first electrode plate contact 191 may electrically connect the first electrode plate 110 and the second wiring layer 182. The first electrode plate contact 191 may include a sixth barrier layer 191_1 and a sixth filling layer 191_2. The sixth barrier layer 191_1 may form the side walls of the first electrode plate contact 191. The sixth filling layer 191_2 may fill the space between the sixth barrier layers 191_1.

The second electrode plate contact 192 may be disposed on, e.g., adjacent, the side walls of each of the first to third power rails PR1, PR2 and PR3. For example, as illustrated in FIG. 4, the second electrode plate contact 192 may extend vertically to, e.g., directly, contact the second electrode plate 120, e.g., the second electrode plate contact 192 may extend along the side walls of the first to third power rails PR1, PR2 and PR3 to partially penetrate the second electrode plate 120 at an edge of an upper surface thereof. The second electrode plate contact 192 may penetrate the insulating layer 105, the first interlayer insulating layer 161, the etching stop layer 170, the second interlayer insulating layer 162, and the third interlayer insulating layer 163 in the vertical direction DR3. The second electrode plate contact 192 may electrically connect the second electrode plate 120 and the second wiring layer 182. The second electrode plate contact 192 may include a seventh barrier layer 192_1 and a seventh filling layer 192_2. The seventh barrier layer 192_1 may form the side walls of the second electrode plate contact 192. The seventh filling layer 192_2 may fill the space between the seventh barrier layers 192_1.

Each of the sixth barrier layer 191_1 and the seventh barrier layer 192_1 may include, e.g., at least one of silicon oxide, silicon nitride, silicon oxynitride, and a low dielectric constant material. Although each of the sixth filling layer 191_2 and the seventh filling layer 192_2 may include, e.g., at least one of aluminum (Al), tungsten (W), cobalt (Co), ruthenium (Ru) and molybdenum (Mo), the present disclosure is not limited thereto.

As shown in FIGS. 1 to 3, the first electrode plate contact 191 may include a plurality of hole-shaped contacts spaced apart from each other in the second horizontal direction DR2. Further, the second electrode plate contact 192 may include a plurality of hole-shaped contacts spaced apart from each other in the second horizontal direction DR2. However, the present disclosure is not limited thereto.

The semiconductor device according to some embodiments of the present disclosure may improve reliability, by forming the first electrode plate 110, the second electrode plate 120, and the power rails PR1, PR2 and PR3 to be buried, e.g., completely embedded, inside the insulating layer 105 formed below the gate electrodes G1, G2 and G3 to lower the resistance of the power rails PR1, PR2 and PR3. That is, Hereinafter, a method for manufacturing a semiconductor device according to some embodiments of the present disclosure will be described referring to FIGS. 10 to 22. FIGS. 10 to 22 are cross-sectional views of stages in a method for manufacturing the semiconductor device according to some embodiments of the present disclosure.

Figure 10:
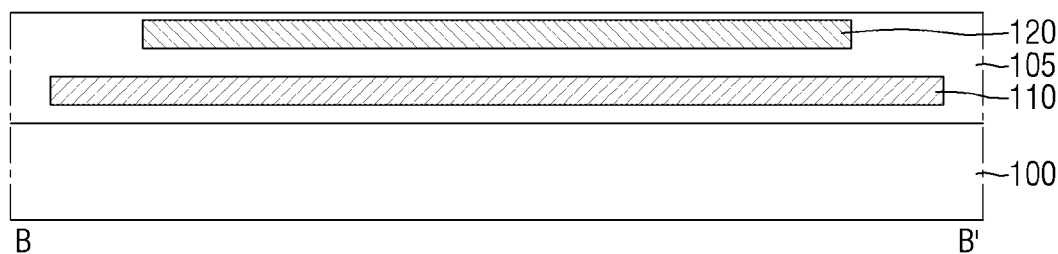
FIGS. 10 to 22 are cross-sectional views of stages in a method for manufacturing a semiconductor device according to some embodiments of the present disclosure.
Figure 10:
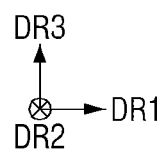

Referring to FIG. 10, the insulating layer 105 may be formed on the upper surface of the base substrate 100. The first electrode plate 110 spaced apart from the upper surface of the base substrate 100 in the vertical direction DR3 may be formed inside the insulating layer 105. Further, the second electrode plate 120 spaced apart from the first electrode plate 110 in the vertical direction DR3 may be formed inside the insulating layer 105. The insulating layer 105 may cover the upper surface of the second electrode plate 120.

Figure 11:
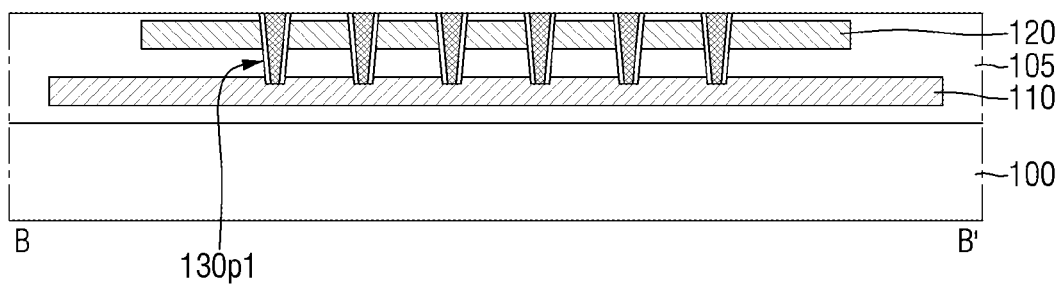
Figure 11:
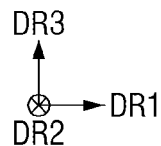

Referring to FIG. 11, the first portion 130p1 of the first power rail contact 130 may be formed to penetrate the insulating layer 105 formed on the upper surface of the second electrode plate 120 and the second electrode plate 120 in the vertical direction DR3. The first portion 130p1 of the first power rail contact 130 may be connected to the first electrode plate 110.

Figure 12:
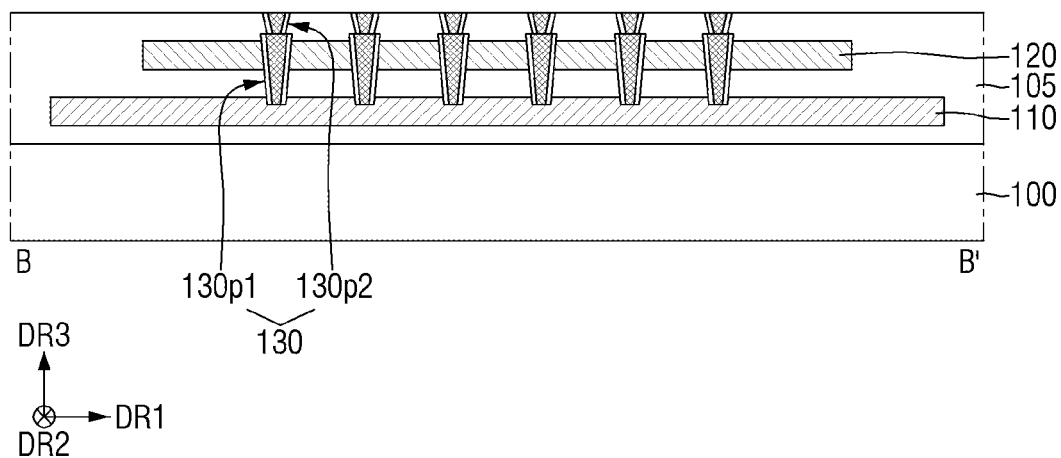

Referring to FIG. 12, the insulating layer 105 may be additionally formed to cover the upper surface of the first portion 130p1 of the first power rail contact 130. Subsequently, the second portion 130p2 of the first power rail contact 130 that penetrates the insulating layer 105 formed additionally in the vertical direction DR3 and is connected to the upper surface of the first portion 130p1 of the first power rail contact 130 may be formed.

Figure 13:
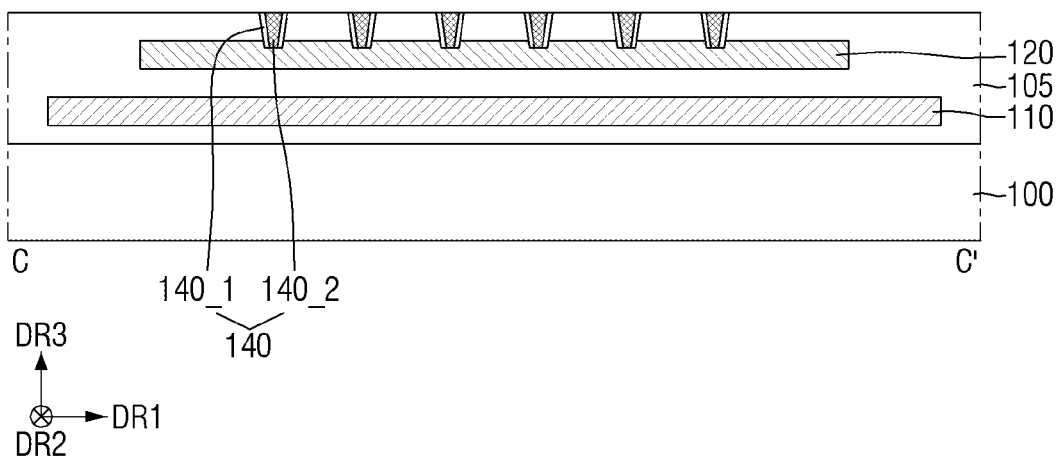

Referring to FIG. 13, while the second portion 130p2 of the first power rail contact 130 described in FIG. 12 is being formed, the second power rail contact 140 that penetrates the insulating layer 105 formed additionally in the vertical direction DR3 and is connected to the second electrode plate 120 may be formed.

Figure 14:
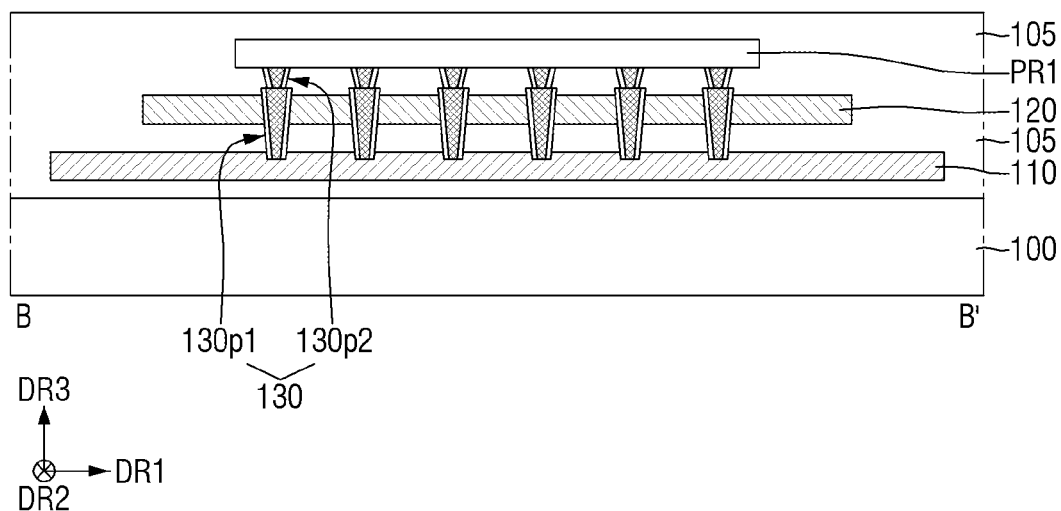
Figure 15:
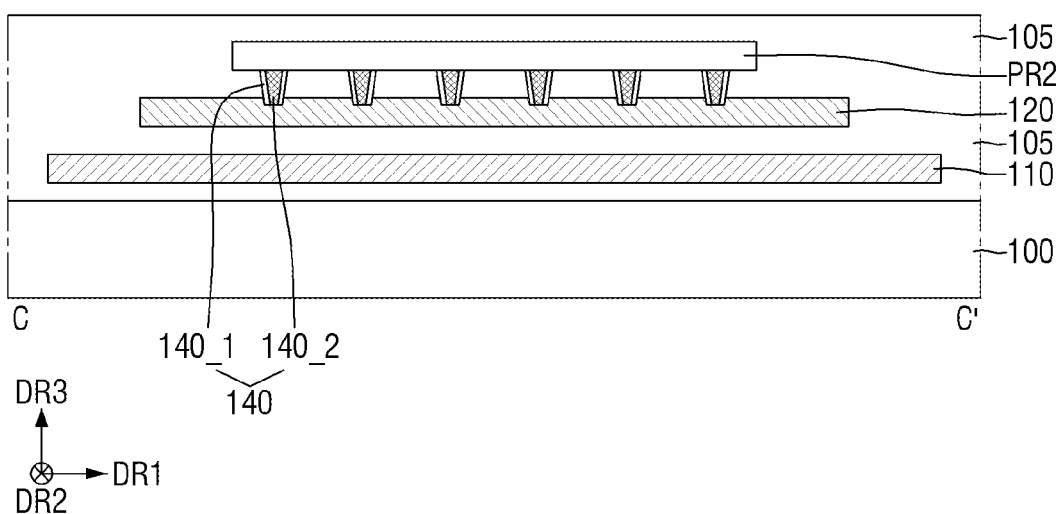

Referring to FIGS. 14 and 15, the first power rail PR1 extending in the first horizontal direction DR1 may be formed on the first power rail contact 130. Further, the second power rail PR2 extending in the first horizontal direction DR1 may be formed on the second power rail contact 140. Subsequently, an additional, e.g., portion of the, insulating layer 105 may be formed to cover the first power rail PR1 and the second power rail PR2.

Figure 16:
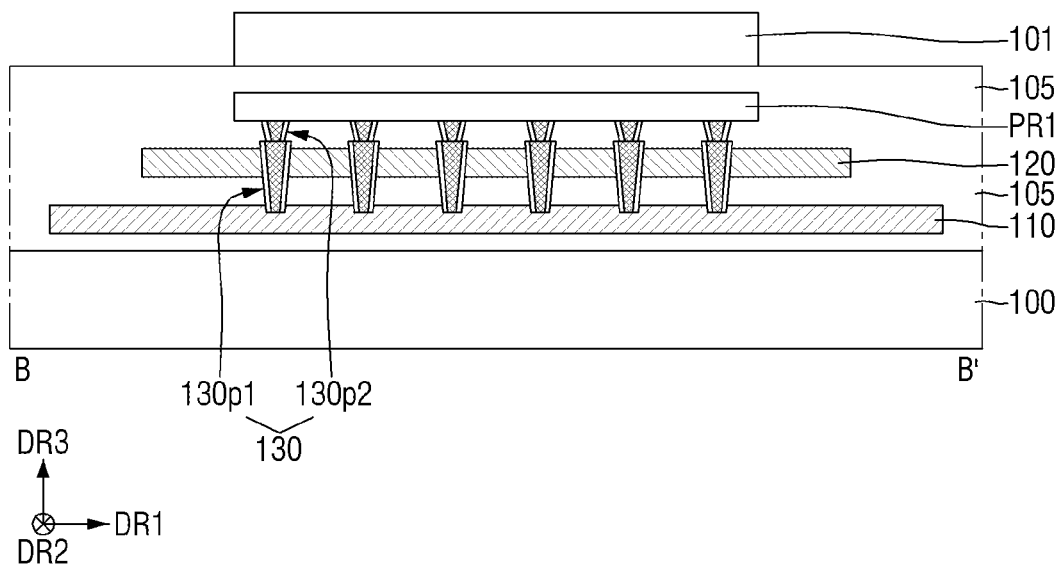

Referring to FIG. 16, a substrate 101 may be formed on the insulating layer 105. For example, the substrate 101 may be attached to the insulating layer 105 through a bonding process. For example, the substrate 101 may be a silicon substrate or an SOI (silicon-on-insulator). In another example, the substrate 101 may include silicon germanium, SGOI (silicon germanium on insulator), indium antimonide, lead tellurium compounds, indium arsenic, indium phosphide, gallium arsenide or gallium antimonide.

Figure 17:
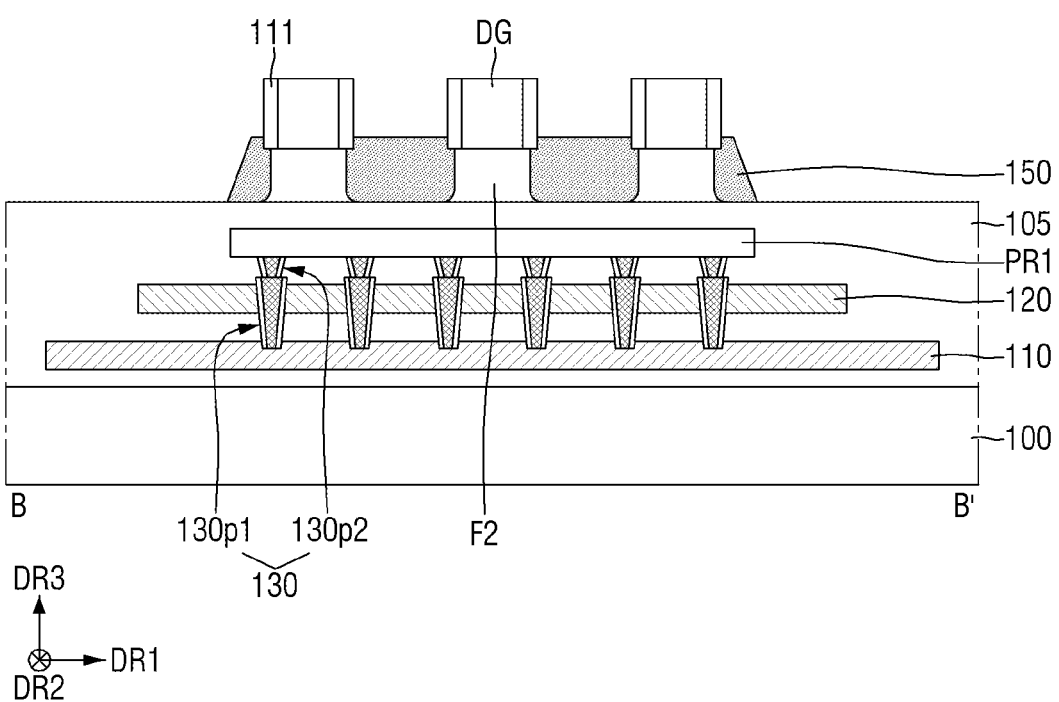

Referring to FIG. 17, a plurality of dummy gates DG may be formed on the substrate 101 of FIG. 16. The plurality of dummy gates DGs may be spaced apart from each other in the first horizontal direction DR1. Each of the plurality of dummy gates DG may extend in the second horizontal direction DR2. Subsequently, a gate spacer 111 may be formed on side walls of each of the plurality of dummy gates DG.

Subsequently, the substrate (101 of FIG. 16) may be etched, using the plurality of dummy gates DG and the gate spacers 111 as masks. Subsequently, a source/drain region 150 may be formed in an etched portion of the substrate (101 of FIG. 16).

Figure 18:
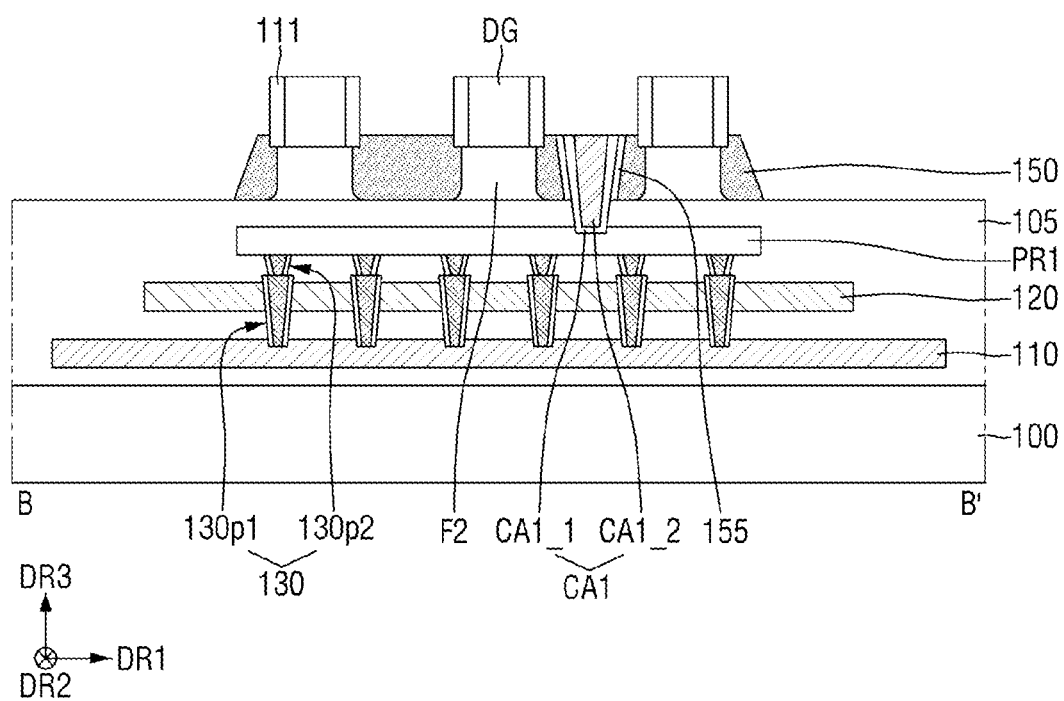

Referring to FIG. 18, the first source/drain contact CA1 may be formed to penetrate the source/drain region 150 formed on the first side wall of the dummy gate DG located at the center among the plurality of dummy gates DG shown in FIG. 18 in the vertical direction DR3. The first source/drain contact CA1 extends to the first power rail PR1 and may be connected to the first power rail PR1. The silicide layer 155 may be formed between the source/drain region 150 and the first source/drain contact CA1.

Figure 19:
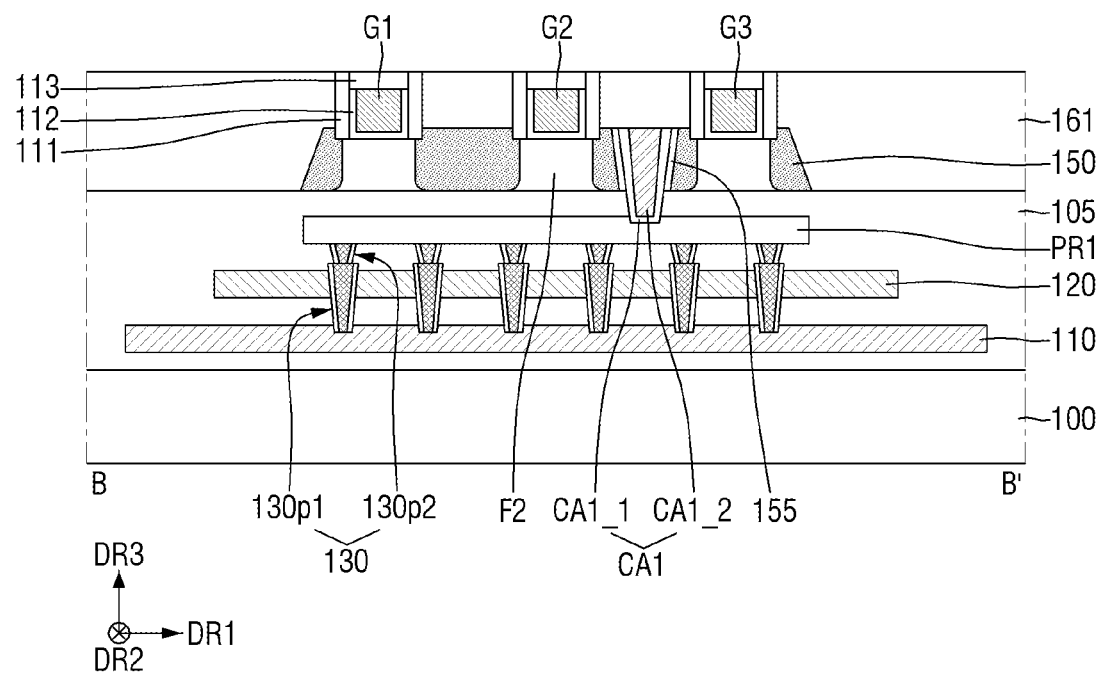

Referring to FIG. 19, the first interlayer insulating layer 161 may be formed to cover the plurality of dummy gates DG, the gate spacer 111, and the source/drain region 150 on the upper surface of the insulating layer 105. Subsequently, after removing the plurality of dummy gates DG, the gate insulating layer 112, the first to third gate electrodes G1, G2 and G3, and the capping pattern 113 may be formed in the portion in which the plurality of dummy gates DG are removed.

Figure 20:
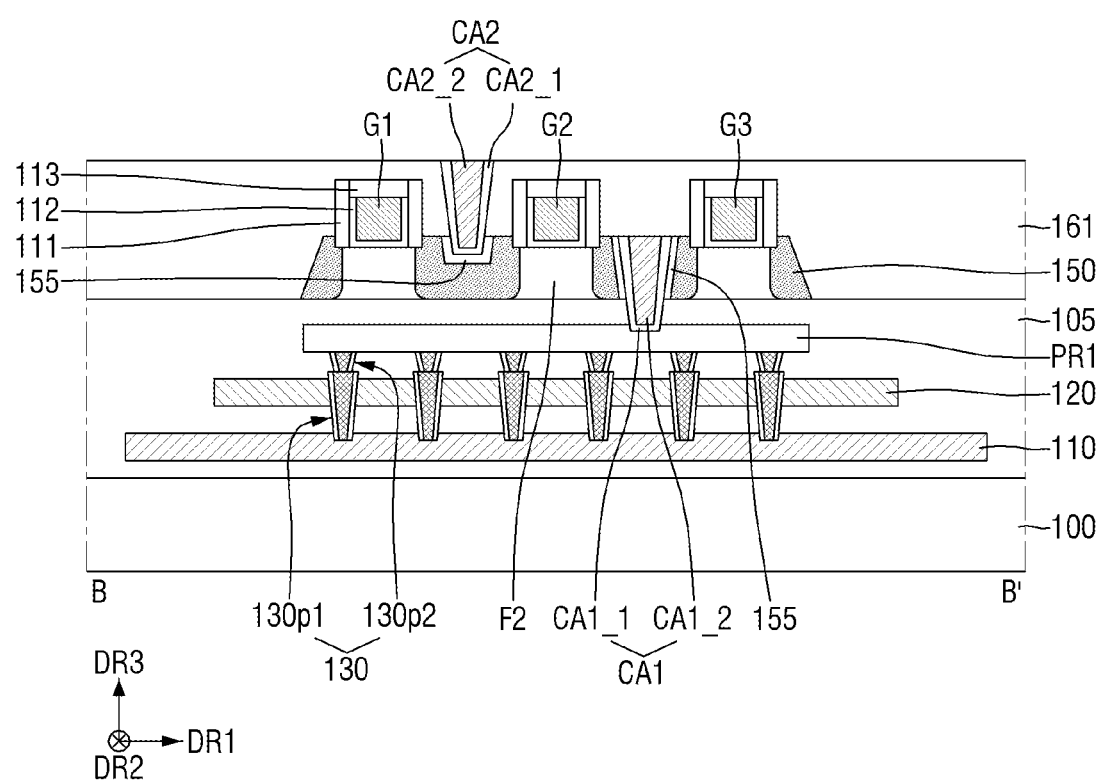

Referring to FIG. 20, an additional, e.g., portion of the, first interlayer insulating layer 161 may be formed on the capping pattern 113. Subsequently, the second source/drain contact CA2 that penetrates the first interlayer insulating layer 161 in the vertical direction DR3 and extends to the source/drain region 150 may be formed. The second source/drain contact CA2 may be formed on the source/drain region 150 formed on a second side wall that is opposite to the first side wall of the dummy gate DG located at the center, among the plurality of dummy gates DG shown in FIG. 20. The silicide layer 155 may be formed between the source/drain region 150 and the second source/drain contact CA2.

Figure 21:
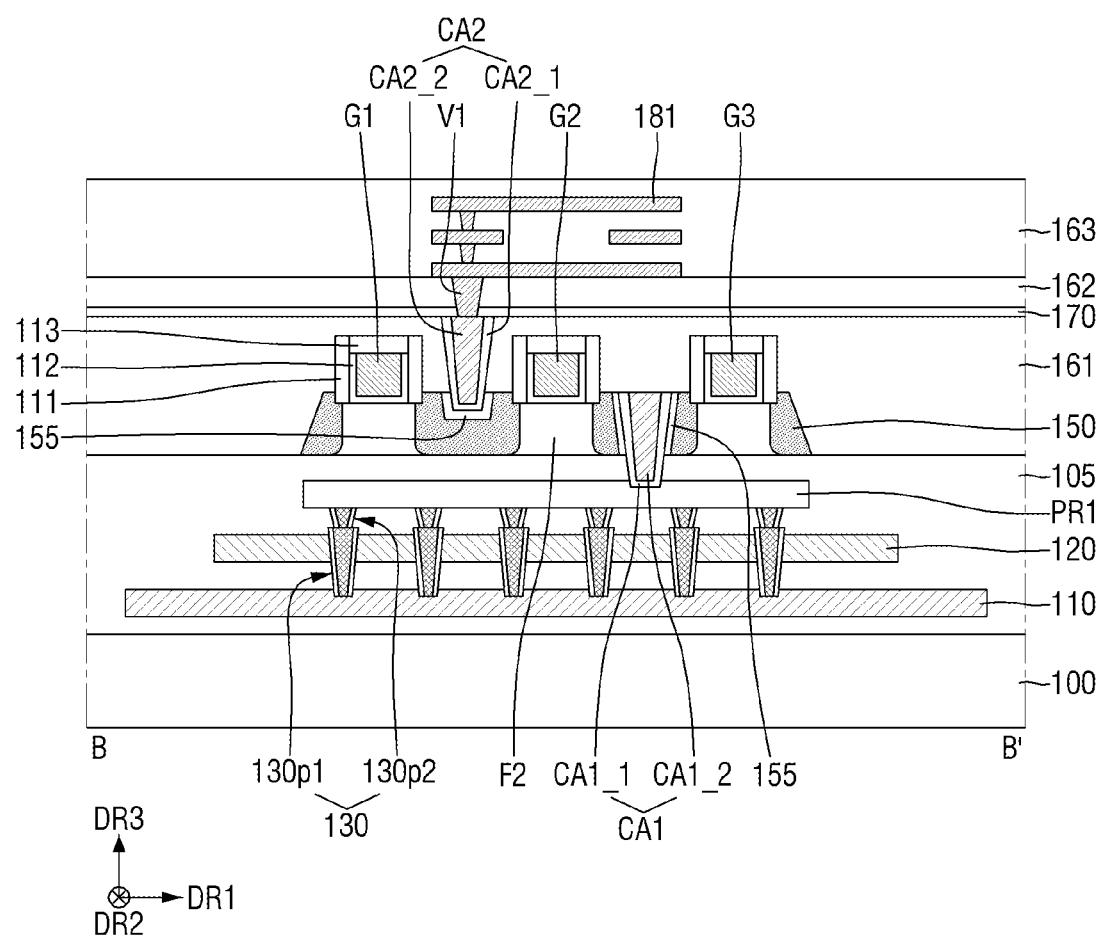

Referring to FIG. 21, the etching stop layer 170 and the second interlayer insulating layer 162 may be sequentially formed on the first interlayer insulating layer 161. Subsequently, the first via V1 which penetrates the etching stop layer 170 and the second interlayer insulating layer 162 in the vertical direction DR3 and is connected to the second source/drain contact CA2 may be formed. Subsequently, the third interlayer insulating layer 163 may be formed on the second interlayer insulating layer 162. The first wiring layer 181 may be formed inside the third interlayer insulating layer 163.

Figure 22:
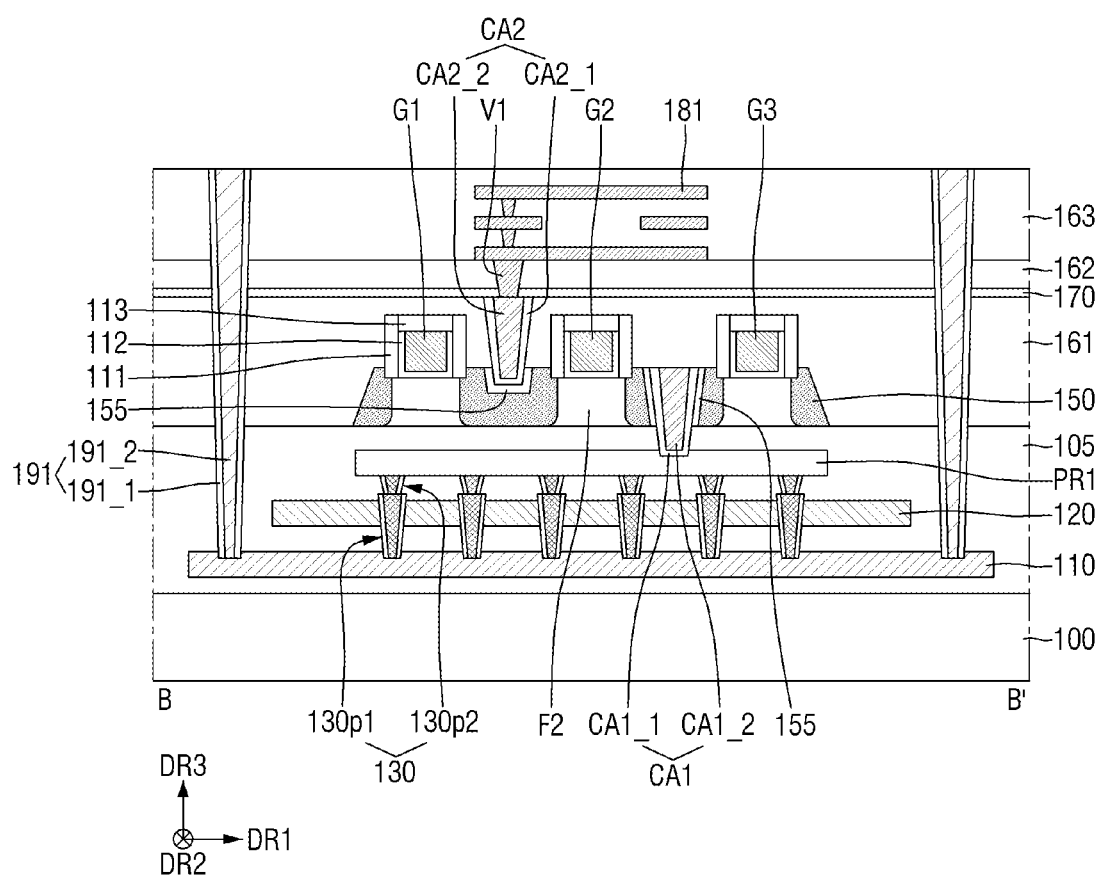

Referring to FIG. 22, the first electrode plate contact 191 may be formed on the side wall of the second electrode plate 120 to penetrate the insulating layer 105, the first interlayer insulating layer 161, the etching stop layer 170, the second interlayer insulating layer 162, and the third interlayer insulating layer 163 in the vertical direction DR3. The first electrode plate contact 191 may be connected to the first electrode plate 110.

Further, while the first electrode plate contact 191 is being formed, the second electrode plate contact 192 shown in FIG. 4 may be formed. The second electrode plate contact 192 may penetrate the insulating layer 105, the first interlayer insulating layer 161, the etching stop layer 170, the second interlayer insulating layer 162, and the third interlayer insulating layer 163 in the vertical direction DR3, and may be connected to the second electrode plate 120.

Subsequently, the fourth interlayer insulating layer 164 may be formed on the third interlayer insulating layer 163. The second wiring layer 182 may be formed inside the fourth interlayer insulating layer 164. The semiconductor device shown in FIGS. 1 to 9 may be manufactured through such a process.

Hereinafter, a semiconductor device according to some other embodiments of the present disclosure will be described referring to FIG. 23. Differences relative to the semiconductor device shown in FIGS. 1 to 9 will be mainly described.

Figure 23:
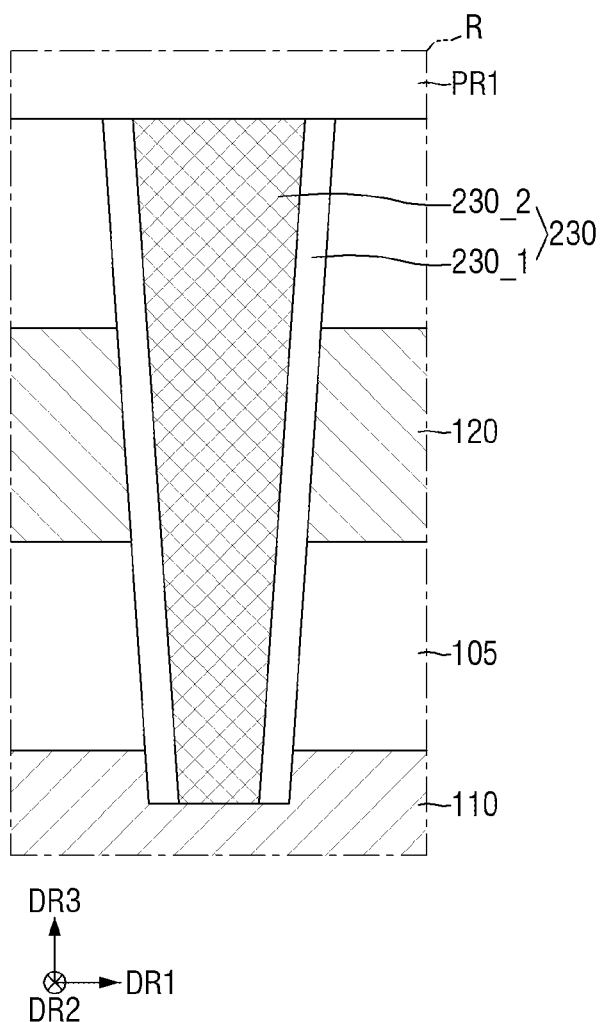
FIG. 23 is an enlarged view of a semiconductor device according to some other embodiments of the present disclosure.

FIG. 23 is an enlarged view of a semiconductor device according to some other embodiments of the present disclosure.

Referring to FIG. 23, in the semiconductor device according to some other embodiments of the present disclosure, side walls of the first power rail contact 230 may have a continuous slope profile. The first power rail contact 230 may include first barrier layers 230_1 that form the side walls of the first power rail contact 230, and a first filling layer 230_2 that fills the space between the first barrier layers 230_1.

Hereinafter, a semiconductor device according to some other embodiments of the present disclosure will be described referring to FIG. 24. Differences relative to the semiconductor device shown in FIGS. 1 to 9 will be mainly described.

Figure 24:
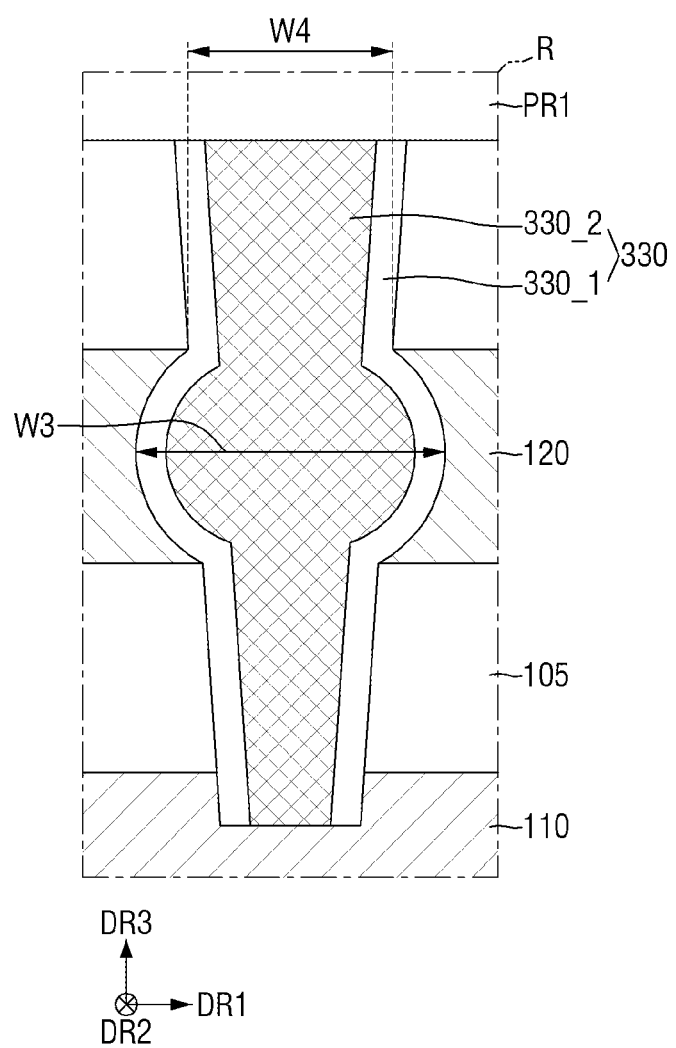
FIG. 24 is an enlarged view of a semiconductor device according to some other embodiments of the present disclosure.

FIG. 24 is an enlarged view of a semiconductor device according to some other embodiments of the present disclosure.

Referring to FIG. 24, in the semiconductor device according to some other embodiment of the present disclosure, a width W3 in the first horizontal direction DR1 of a first power rail contact 330 disposed inside the second electrode plate 120 may be greater than a width W4 in the first horizontal direction DR1 of the first power rail contact 330 at an interface between the upper surface of the second electrode plate 120 and the insulating layer 105. The first power rail contact 330 may include first barrier layers 330_1 that form the side walls of the first power rail contact 330, and a first filling layer 330_2 that fills the space between the first barrier layers 330_1.

Hereinafter, a semiconductor device according to some other embodiments of the present disclosure will be described referring to FIG. 25. Differences relative to the semiconductor device shown in FIGS. 1 to 9 will be mainly described.

Figure 25:
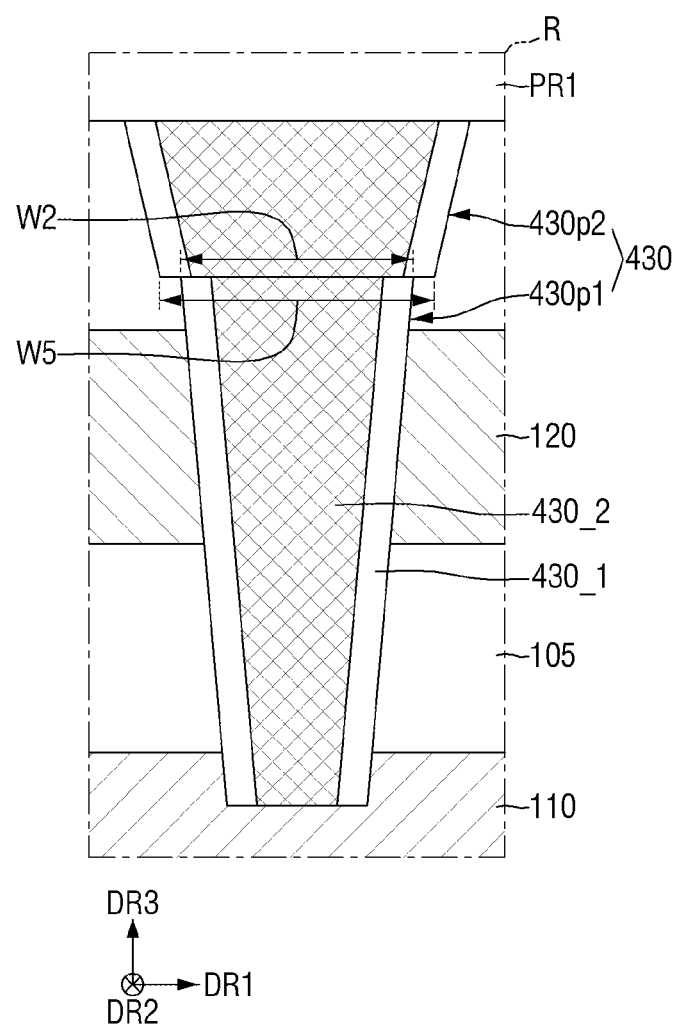
FIG. 25 is an enlarged view of a semiconductor device according to some other embodiments of the present disclosure.

FIG. 25 is an enlarged view of a semiconductor device according to some other embodiments of the present disclosure.

Referring to FIG. 25, in the semiconductor device according to some other embodiment of the present disclosure, a width W2 in the first horizontal direction DR1 of an upper surface of a first portion 430p1 of a first power rail contact 430 may be smaller than a width W5 in the first horizontal direction DR1 of a lower surface of a second portion 430p2 of the first power rail contact 430. The first power rail contact 430 may include first barrier layers 430_1 that form the side walls of the first power rail contact 430, and a first filling layer 430_2 that fills the space between the first barrier layers 430_1.

Hereinafter, a semiconductor device according to some other embodiments of the present disclosure will be described referring to FIG. 26. Differences relative to the semiconductor device shown in FIGS. 1 to 9 will be mainly described.

Figure 26:
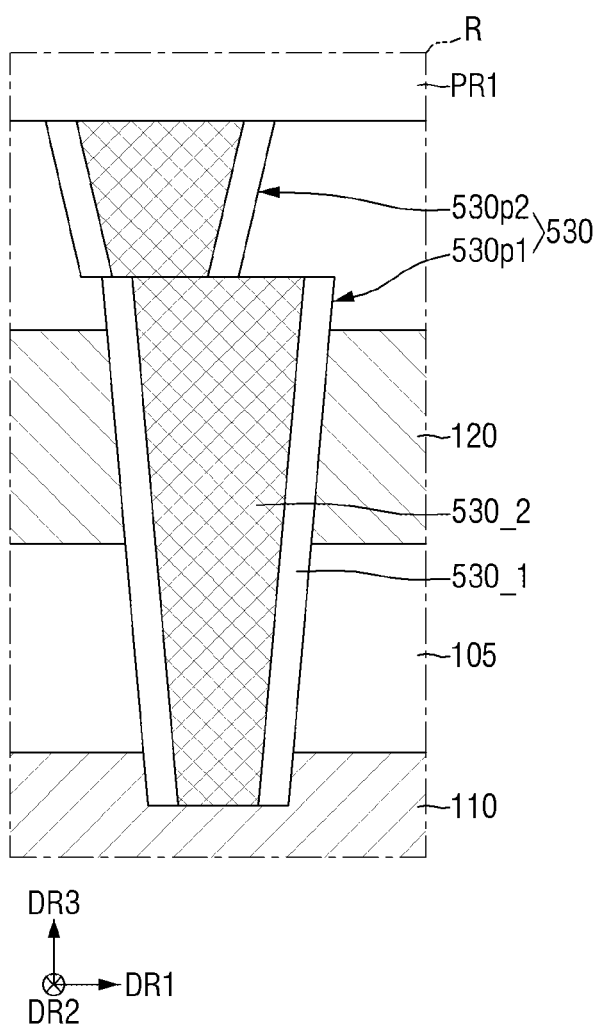
FIG. 26 is an enlarged view of a semiconductor device according to some other embodiments of the present disclosure.

FIG. 26 is an enlarged view of a semiconductor device according to some other embodiments of the present disclosure.

Referring to FIG. 26, in the semiconductor device according to some other embodiment of the present disclosure, a second portion 530p2 of a first power rail contact 530 may be misaligned with a first portion 530p1 of the first power rail contact 530. For example, at least a part of the upper surface of the first portion 530p1 of the first power rail contact 530 may be in contact with the insulating layer 105. Further, at least a part of the lower surface of the second portion 530p2 of the first power rail contact 530 may be in contact with the insulating layer 105.

Hereinafter, a semiconductor device according to some other embodiments of the present disclosure will be described referring to FIGS. 27 and 28. Differences relative to the semiconductor device shown in FIGS. 1 to 9 will be mainly described.

Figure 27:
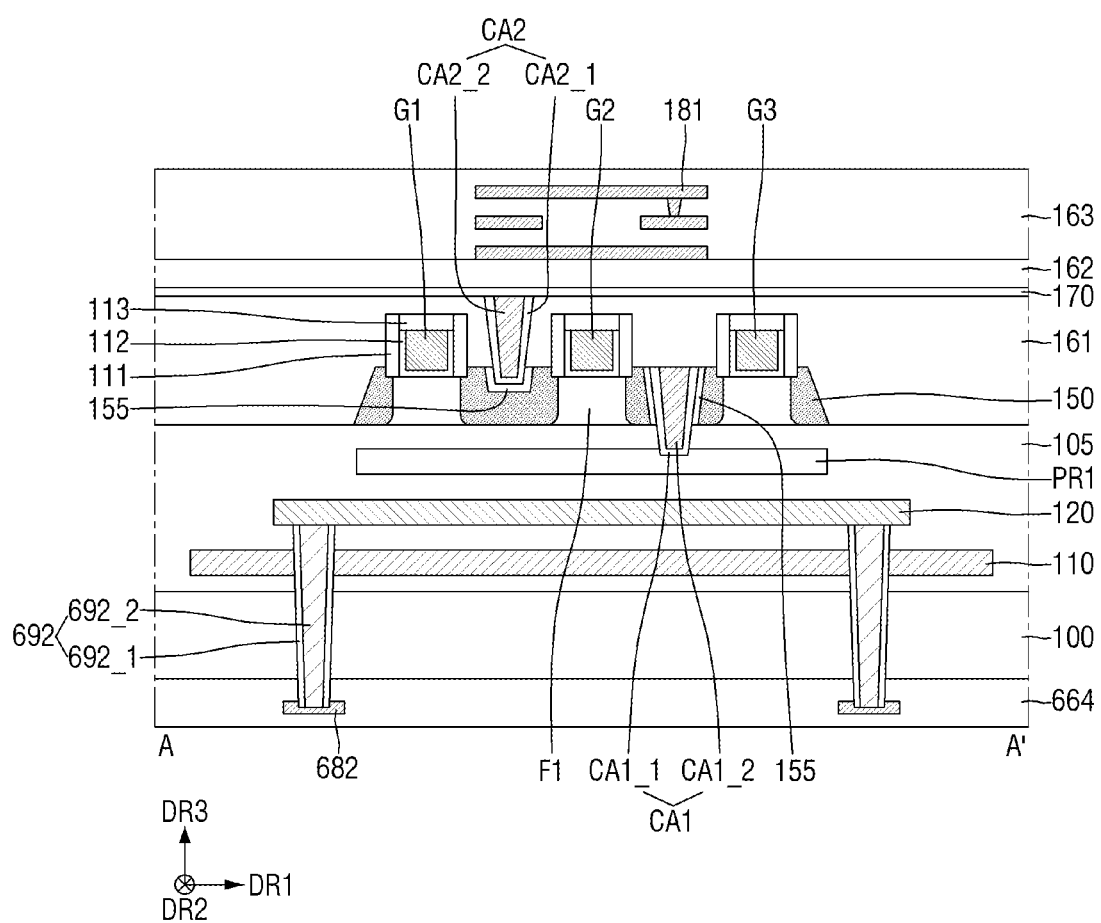
FIGS. 27 and 28 are cross-sectional views of a semiconductor device according to some other embodiment of the present disclosure.
Figure 28:
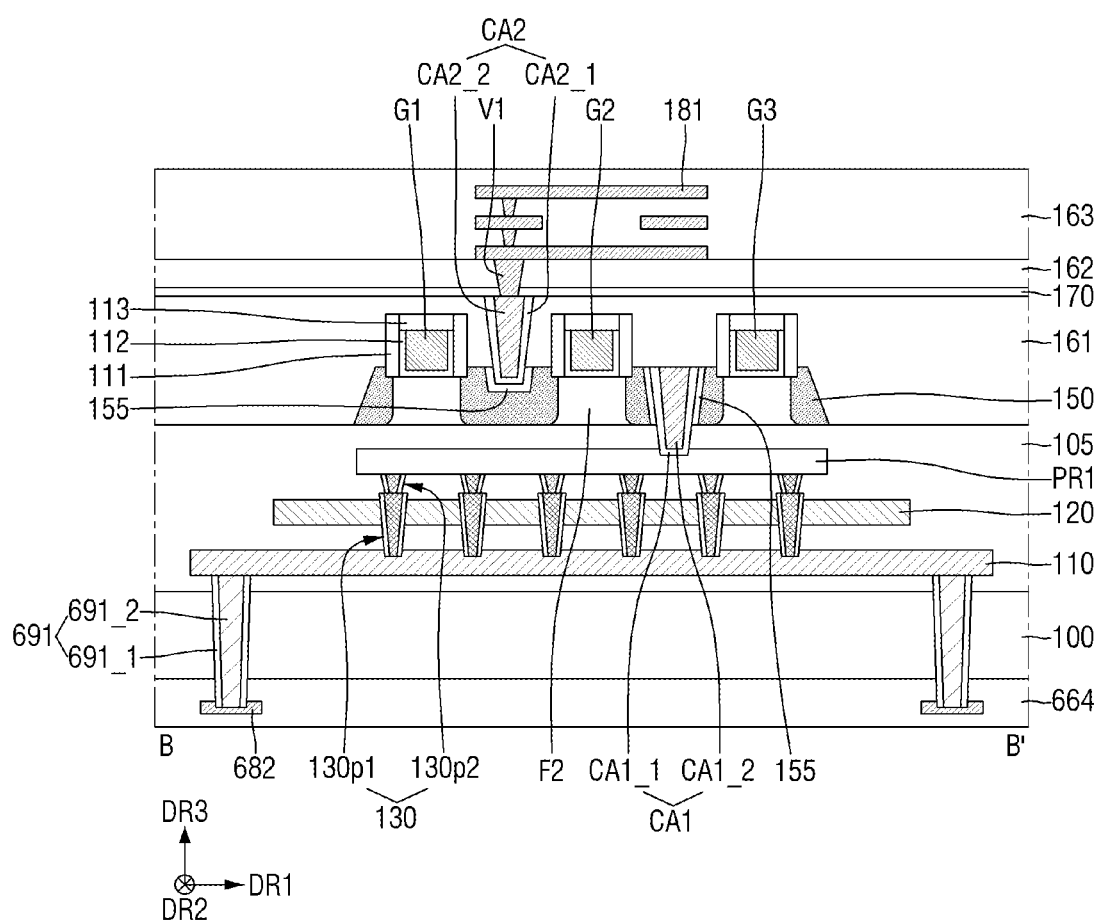

FIGS. 27 and 28 are cross-sectional views of a semiconductor device according to some other embodiment of the present disclosure.

Referring to FIGS. 27 and 28, in the semiconductor device according to some other embodiment of the present disclosure, each of a first electrode plate contact 691 and a second electrode plate contact 692 may extend to penetrate the base substrate 100 in the vertical direction DR3.

A fourth interlayer insulating layer 664 may be disposed on the lower surface of the base substrate 100. A second wiring layer 682 may be disposed inside the fourth interlayer insulating layer 664. The first electrode plate contact 691 penetrates a part of the base substrate 100 and the fourth interlayer insulating layer 664 in the vertical direction DR3, and may be electrically connected to the second wiring layer 682. The first electrode plate contact 691 may include sixth barrier layers 691_1 that form side walls of the first electrode plate contact 691, and a sixth filling layer 691_2 that fills the space between the sixth barrier layers 691_1.

The second electrode plate contact 692 penetrates a part of the base substrate 100, the first electrode plate 110, and the fourth interlayer insulating layer 664 in the vertical direction DR3, and may be electrically connected to the second wiring layer 682. The second electrode plate contact 692 may include seventh barrier layers 692_1 that form side walls of the second electrode plate contact 692, and a seventh filling layer 692_2 that fills the space between the seventh barrier layers 692_1.

Hereinafter, a semiconductor device according to some other embodiments of the present disclosure will be described referring to FIG. 29. Differences relative to the semiconductor device shown in FIGS. 1 to 9 will be mainly described.

Figure 29:
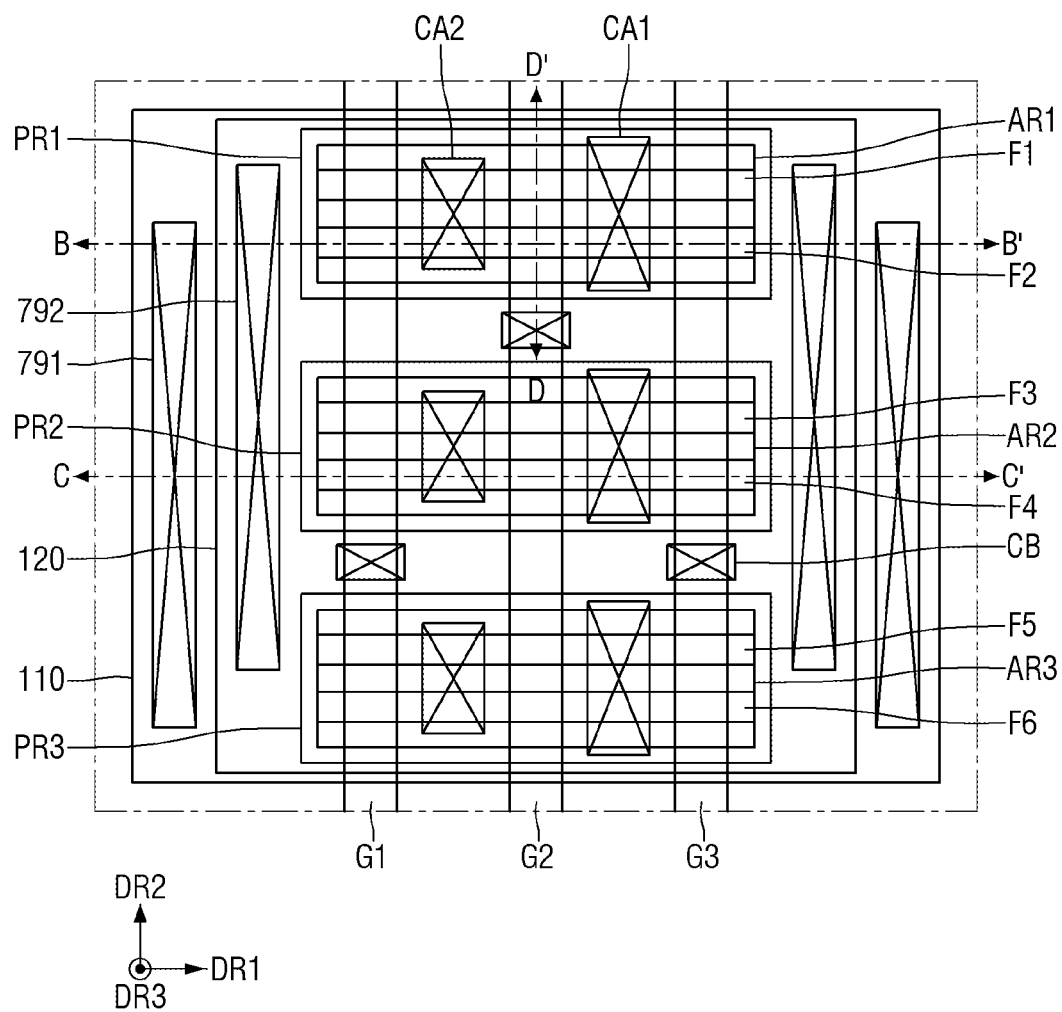
FIG. 29 is a layout diagram of a semiconductor device according to some other embodiments of the present disclosure.

FIG. 29 is a layout diagram of a semiconductor device according to some other embodiments of the present disclosure.

Referring to FIG. 29, in the semiconductor device according to some other embodiment of the present disclosure, a first electrode plate contact 791 may extend in the second horizontal direction DR2. Also, a second electrode plate contact 792 may extend in the second horizontal direction DR2.

Hereinafter, a semiconductor device according to some other embodiments of the present disclosure will be described referring to FIGS. 30 and 32. Differences relative to the semiconductor device shown in FIGS. 1 to 9 will be mainly described.

Figure 30:
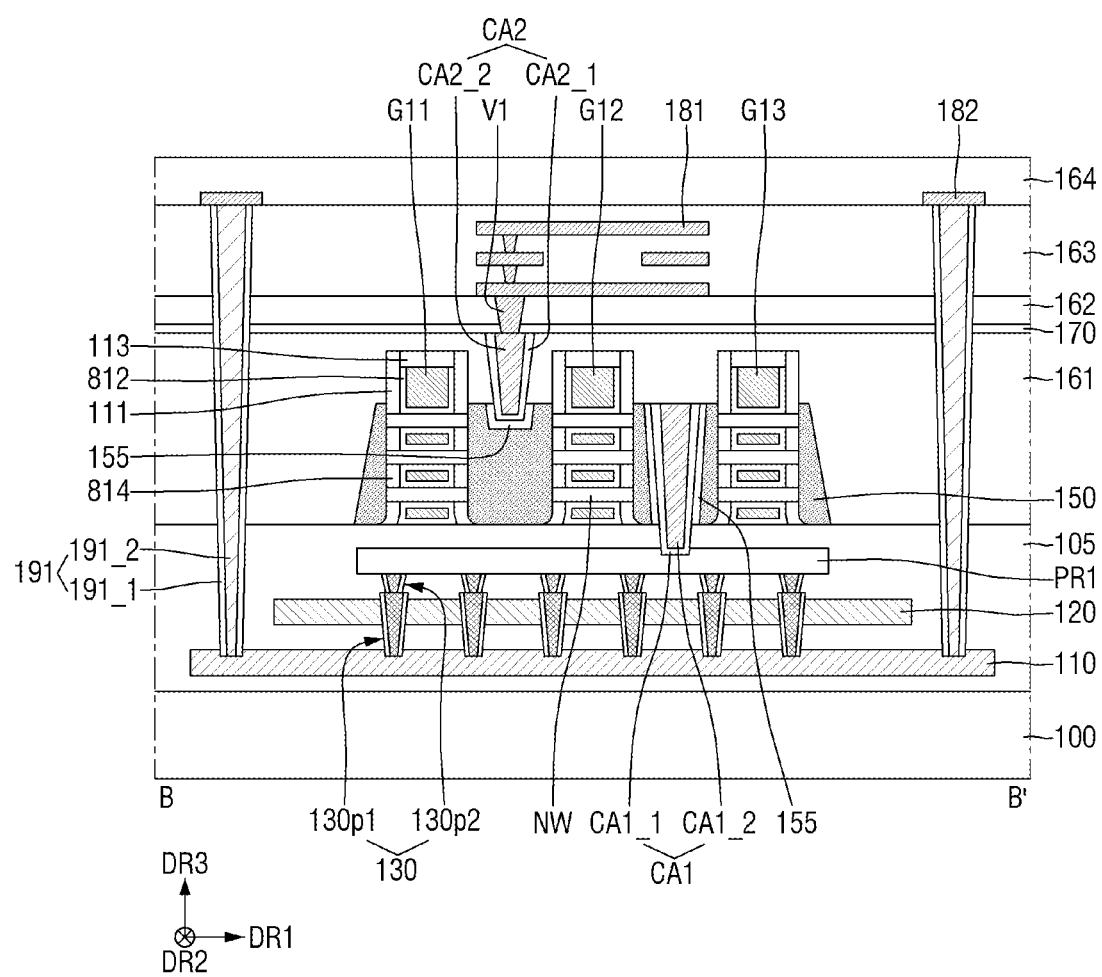
FIGS. 30 to 32 are cross-sectional views of a semiconductor device according to some other embodiments of the present disclosure.
Figure 31:
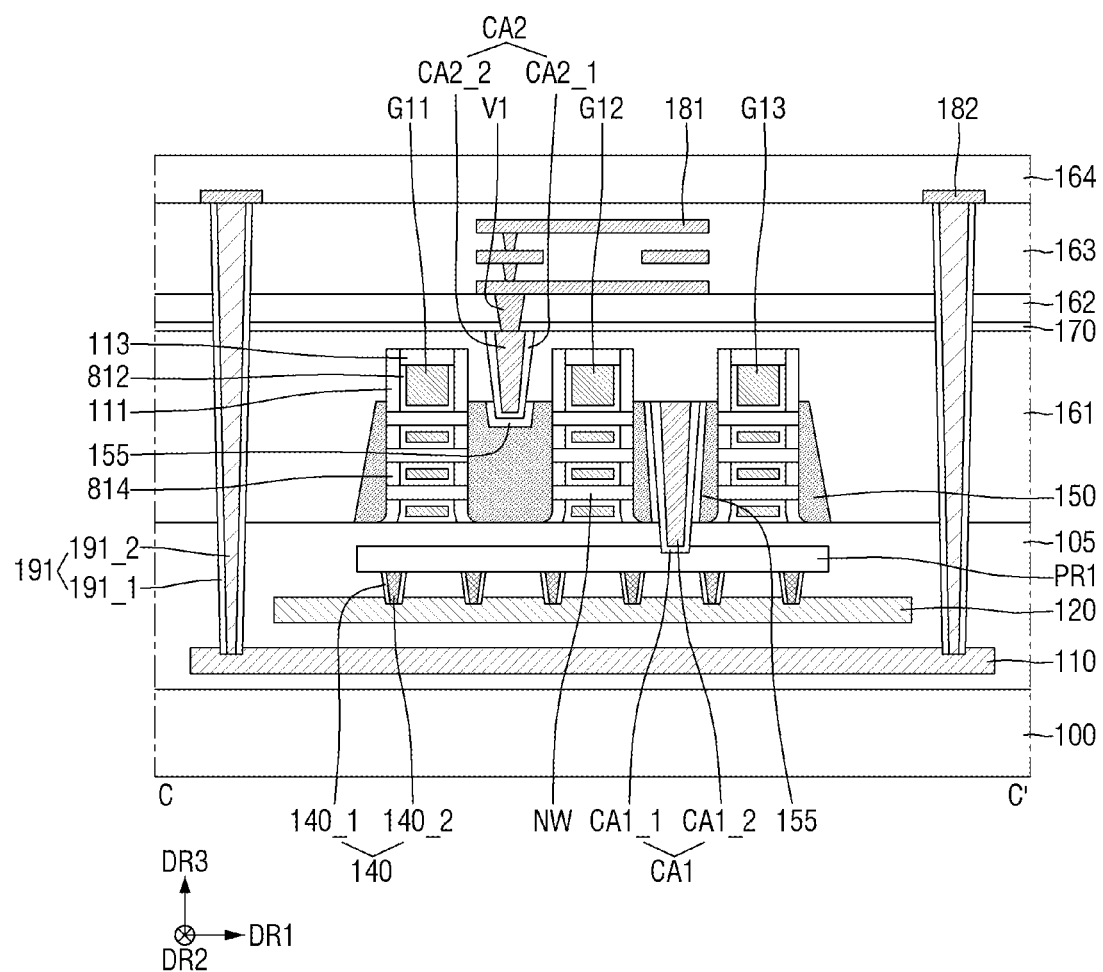
Figure 32:
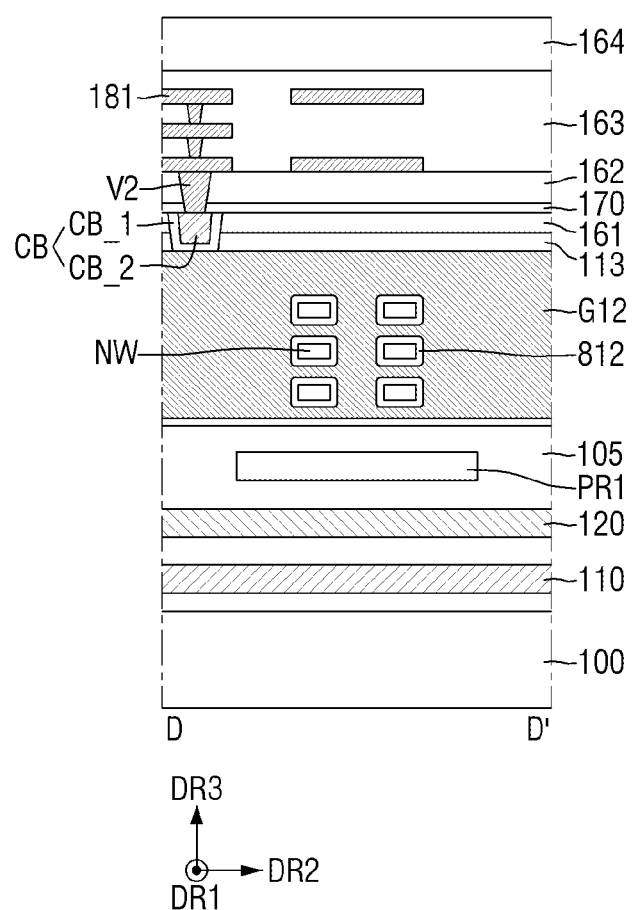

FIGS. 30 to 32 are cross-sectional views of a semiconductor device according to some other embodiments of the present disclosure.

Referring to FIGS. 30 and 32, the semiconductor device according to some other embodiment of the present disclosure may include an MBCFET™ (Multi-Bridge Channel Field Effect Transistor). In detail, the semiconductor device according to some other embodiments of the present disclosure may include a plurality of nanosheets NW that are sequentially stacked to be spaced apart from each other in the vertical direction DR3 on the insulating layer 105 in the first to third active regions (AR1, AR2 and AR3 of FIG. 1). Although FIGS. 30 and 32 show three nanosheets stacked in the vertical direction DR3, this is merely for convenience of explanation, and the number of stacked nanosheets is not limited.

Each of the first to third gate electrodes G11, G12 and G13 may surround a plurality of nanosheets NW. For example, the plurality of nanosheets NW surrounded by each of the first to third gate electrodes G11, G12 and G13 in the first active region (AR1 of FIG. 1) may be spaced apart from each other in the first horizontal direction DR1. The source/drain region 150 may be disposed between the plurality of nanosheets NW spaced apart from each other in the first horizontal direction DR1.

An internal spacer 814 may be disposed between each of the first to third gate electrodes G11, G12 and G13 and the source/drain region 150. In some other embodiments, the internal spacer 814 may be omitted.

A gate insulating layer 812 may be disposed between each of the first to third gate electrodes G11, G12 and G13 and the insulating layer 105, between each of the first to third gate electrodes G11, G12 and G13 and the plurality of nanosheets NW, between each of the first to third gate electrodes G11, G12 and G13 and the internal spacer 814, and between each of the first to third gate electrodes G11, G12 and G13 and the gate spacer 111.

By way of summation and review, aspects of the present disclosure provide a semiconductor device in which reliability is improved, by forming electrode plates which are power supply nodes (VCC and VDD) and power rails to be buried inside an insulating layer formed below a gate electrode to lower the resistance of the power rails. That is, the resistance of a power rail may be reduced by using a power network in the form of a buried plate, and the misalignment may be lowered by making the power rail and the element in a top-down manner. Further, the contact of the first electrode plate (VCC) has a structure partially penetrating the second electrode plate (VDD).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a base substrate;
    a first electrode plate on the base substrate;
    a first power rail on the first electrode plate, the first power rail extending in a first horizontal direction and overlapping the first electrode plate in a vertical direction;
    a second power rail on the first electrode plate, the second power rail extending in the first horizontal direction and overlapping the first electrode plate in the vertical direction, and the second power rail being spaced apart from the first power rail in a second horizontal direction different from the first horizontal direction;
    a first power rail contact electrically connecting the first electrode plate and the first power rail;
    an insulating layer on the base substrate, the insulating layer surrounding the first electrode plate, the first power rail, and the second power rail; and
    a gate electrode extending in the second horizontal direction on the insulating layer.

2. The semiconductor device as claimed in claim 1, further comprising:
    a source/drain region on opposite side walls of the gate electrode; and
    a first source/drain contact penetrating the source/drain region in the vertical direction on a first side wall of the gate electrode, the first source/drain contact electrically connecting the source/drain region to the first power rail.

3. The semiconductor device as claimed in claim 2, wherein an upper surface of the source/drain region is on a same plane as an upper surface of the first source/drain contact.

4. The semiconductor device as claimed in claim 2, further comprising a second source/drain contact extending in the vertical direction from an upper surface of the source/drain region, the second source/drain contact being on a second side wall of the gate electrode opposite to the first side wall of the gate electrode.

5. The semiconductor device as claimed in claim 1, further comprising a second electrode plate on the first electrode plate inside the insulating layer, the second electrode plate overlapping each of the first and second power rails in the vertical direction, and the first power rail contact penetrating the second electrode plate in the vertical direction.

6. The semiconductor device as claimed in claim 5, wherein the first power rail contact includes:
    a first portion connected to the first electrode plate, the first portion penetrating the second electrode plate in the vertical direction, and an upper surface of the first portion being higher than an upper surface of the second electrode plate; and
    a second portion connecting the first portion and the first power rail.

7. The semiconductor device as claimed in claim 6, wherein a width of the upper surface of the first portion of the first power rail contact in the first horizontal direction is different from a width of a lower surface of the second portion of the first power rail contact in the first horizontal direction.

8. The semiconductor device as claimed in claim 6, wherein at least a part of the upper surface of the first portion of the first power rail contact and at least a part of a lower surface of the second portion of the first power rail contact are each in contact with the insulating layer.

9. The semiconductor device as claimed in claim 5, further comprising a second power rail contact extending in the vertical direction on an upper surface of the second electrode plate, the second power rail contact electrically connecting the second electrode plate to the second power rail.

10. The semiconductor device as claimed in claim 5, wherein a width of the first power rail contact inside the second electrode plate in the first horizontal direction is greater than a width of the first power rail contact in the first horizontal direction at an interface between an upper surface of the second electrode plate and the insulating layer.

11. The semiconductor device as claimed in claim 1, wherein side walls of the first power rail contact have a continuous slope profile.

12. The semiconductor device as claimed in claim 1, further comprising a plurality of nanosheets stacked on the insulating layer and spaced apart from each other in the vertical direction, the gate electrode surrounding the plurality of nanosheets.

13. A semiconductor device, comprising:
    a base substrate;
    a first electrode plate on the base substrate;
    a second electrode plate on the first electrode plate;
    a first power rail extending in a first horizontal direction on the second electrode plate;
    a second power rail extending in the first horizontal direction on the second electrode plate, the second power rail being spaced apart from the first power rail in a second horizontal direction different from the first horizontal direction;
    an active pattern extending in the first horizontal direction on the first power rail;
    a gate electrode which extends in the second horizontal direction on the active pattern and intersects each of the first and second power rails;
    a source/drain region on opposite side walls of the gate electrode;
    a source/drain contact which penetrates the source/drain region in a vertical direction on a first side wall of the gate electrode, the source/drain contact electrically connecting the source/drain region to the first power rail; and
    a power rail contact which penetrates the second electrode plate in the vertical direction, the power rail contact electrically connecting the first electrode plate and the first power rail.

14. The semiconductor device as claimed in claim 13, wherein each of the first power rail and the second power rail overlaps the first electrode plate in the vertical direction.

15. The semiconductor device as claimed in claim 13, further comprising an insulating layer on the base substrate, the insulating layer surrounding the first electrode plate, the second electrode plate, the first power rail, and the second power rail.

16. The semiconductor device as claimed in claim 15, further comprising:
- an interlayer insulating layer which surrounds the gate electrode;
- a first electrode plate contact on a side wall of the second electrode plate, the first electrode plate contact penetrating the insulating layer and the interlayer insulating layer in the vertical direction, and being electrically connected to the first electrode plate; and
- a second electrode plate contact penetrating the insulating layer and the interlayer insulating layer in the vertical direction, the second electrode plate contact being electrically connected to the second electrode plate.

17. The semiconductor device as claimed in claim 16, wherein each of the first electrode plate contact and the second electrode plate contact has a hole shape.

18. The semiconductor device as claimed in claim 16, wherein each of the first electrode plate contact and the second electrode plate contact extends in the second horizontal direction.

19. The semiconductor device as claimed in claim 13, further comprising:
- a first electrode plate contact which penetrates the base substrate in the vertical direction, and is electrically connected to the first electrode plate; and
- a second electrode plate contact which penetrates the base substrate and the first electrode plate in the vertical direction, and is electrically connected to the second electrode plate.

20. A semiconductor device, comprising:
- a base substrate;
- a first electrode plate on the base substrate, the first electrode plate having a flat plate shape;
- a second electrode plate on the first electrode plate, the second electrode plate having a flat plate shape;
- a first power rail which extends in a first horizontal direction on the second electrode plate, the first power rail overlapping each of the first and second electrode plates in a vertical direction;
- a second power rail which extends in the first horizontal direction on the second electrode plate, the second power rail being spaced apart from the first power rail in a second horizontal direction different from the first horizontal direction, and the second power rail overlapping each of the first and second electrode plates in the vertical direction;
- a first power rail contact which penetrates the second electrode plate in the vertical direction, the first power rail contact electrically connecting the first electrode plate and the first power rail;
- a second power rail contact which extends in the vertical direction on an upper surface of the second electrode plate, the second power rail contact electrically connecting the second electrode plate to the second power rail;
- an insulating layer on the base substrate, the insulating layer surrounding the first electrode plate, the second electrode plate, the first power rail, and the second power rail;
- a gate electrode extending in the second horizontal direction on the insulating layer;
- a source/drain region on opposite side walls of the gate electrode;
- a first source/drain contact which penetrates the source/drain region in the vertical direction on a first side wall of the gate electrode, the first source/drain contact electrically connecting the source/drain region to the first power rail; and
- a second source/drain contact which extends from an upper surface of the source/drain region in the vertical direction, the second source/drain contact being on a second side wall of the gate electrode opposite to the first side wall of the gate electrode.

* * * * *